United States Patent
Iwata et al.

(10) Patent No.: US 10,692,708 B2
(45) Date of Patent: Jun. 23, 2020

(54) SPUTTERING CATHODE, SPUTTERING DEVICE, AND METHOD FOR PRODUCING FILM-FORMED BODY

(71) Applicant: Keihin Ramtech Co., Ltd., Kamakura-shi, Kanagawa (JP)

(72) Inventors: Hiroshi Iwata, Kamakura (JP); Toshiyuki Nedu, Kamakura (JP); Yuta Takakuwa, Kamakura (JP); Naoya Okada, Kamakura (JP); Ippei Sato, Kamakura (JP); Naonori Shibata, Kamakura (JP); Keiichi Hashimoto, Kamakura (JP)

(73) Assignee: KEIHIN RAMTECH CO., LTD., Kanagawa (JP)

( * ) Notice: Subject to any disclaimer, the term of this patent is extended or adjusted under 35 U.S.C. 154(b) by 0 days.

(21) Appl. No.: 16/297,121

(22) Filed: Mar. 8, 2019

(65) Prior Publication Data

US 2019/0203346 A1   Jul. 4, 2019

Related U.S. Application Data

(63) Continuation of application No. 15/735,847, filed as application No. PCT/JP2017/002463 on Jan. 25, 2017, now abandoned.

(30) Foreign Application Priority Data

Mar. 30, 2016 (JP) .................................. 2016-067068
Aug. 31, 2016 (JP) .................................. 2016-168705

(51) Int. Cl.
*H01J 37/34* (2006.01)
*C23C 14/34* (2006.01)
(Continued)

(52) U.S. Cl.
CPC ...... *H01J 37/3452* (2013.01); *C23C 14/3407* (2013.01); *C23C 14/35* (2013.01);
(Continued)

(58) Field of Classification Search
CPC .. H01J 37/345; H01J 37/3452; H01J 37/3423; H01J 37/342; C23C 14/3407;
(Continued)

(56) References Cited

U.S. PATENT DOCUMENTS 3,878,085 A * 4/1975 Corbani ................. H01J 37/34
                                                  204/192.12
4,915,805 A    4/1990 Rust
(Continued)

FOREIGN PATENT DOCUMENTS

CN   101755071 A   6/2010
JP   S5855566 A    4/1983
(Continued)

OTHER PUBLICATIONS

International Search Report dated Apr. 11, 2017 for International Patent Application No. PCT/JP2017/002463.
(Continued)

*Primary Examiner* — Michael A Band
(74) *Attorney, Agent, or Firm* — Potomac Law Group, PLLC; Kenneth Fagin

(57) ABSTRACT

This sputtering cathode has a sputtering target having a tubular shape in which the cross-sectional shape thereof has a pair of long side sections facing each other, and an erosion surface facing inward. Using the sputtering target, while moving a body to be film-formed, which has a film formation region having a narrower width than the long side sections of the sputtering target, parallel to one end face of the sputtering target and at a constant speed in a direction perpendicular to the long side sections above a space sur-
(Continued)

rounded by the sputtering target, discharge is performed such that a plasma circulating along the inner surface of the sputtering target is generated, and the inner surface of the long side sections of the sputtering target is sputtered by ions in the plasma generated by a sputtering gas to perform film formation in the film formation region of the body to be film-formed.

6 Claims, 24 Drawing Sheets

(51) Int. Cl.
C23C 14/35 (2006.01)
C23C 14/56 (2006.01)

(52) U.S. Cl.
CPC .......... H01J 37/342 (2013.01); H01J 37/345 (2013.01); H01J 37/3423 (2013.01); C23C 14/562 (2013.01)

(58) Field of Classification Search
CPC ....... C23C 14/34; C23C 14/35; C23C 14/562; H05H 1/50
See application file for complete search history.

(56) References Cited

U.S. PATENT DOCUMENTS

| | | | |
|---|---|---|---|
| 4,933,057 A * | 6/1990 | Sebastiano | C03C 17/002 204/192.12 |
| 5,178,739 A | 1/1993 | Barnes et al. | |
| 5,378,341 A * | 1/1995 | Drehman | C23C 14/3407 204/192.24 |
| 5,728,280 A | 3/1998 | Scherer | |
| 6,267,851 B1 * | 7/2001 | Hosokawa | C23C 14/352 204/192.12 |
| 6,337,001 B1 | 1/2002 | Haag et al. | |
| 6,444,100 B1 | 9/2002 | McLeod | |
| 6,551,477 B2 | 4/2003 | Glocker et al. | |
| 6,881,311 B2 | 4/2005 | Kadokura et al. | |
| 8,382,966 B2 * | 2/2013 | Choi | C23C 14/352 204/298.18 |
| 2006/0081467 A1 | 4/2006 | Nagashima et al. | |
| 2007/0205096 A1 | 9/2007 | Nagashima | |
| 2008/0011600 A1 | 1/2008 | Nagashima | |
| 2012/0181171 A1 | 7/2012 | Wang et al. | |
| 2013/0299345 A1 * | 11/2013 | Abarra | C23C 14/35 204/298.11 |
| 2014/0224644 A1 | 8/2014 | Choi | |
| 2016/0099135 A1 | 4/2016 | Belan et al. | |

FOREIGN PATENT DOCUMENTS

| | | |
|---|---|---|
| JP | H108246 A | 1/1998 |
| JP | 2005048227 A | 2/2005 |
| JP | 2008019478 A | 1/2008 |
| JP | 2009256698 A | 11/2009 |
| JP | 5102470 B2 | 12/2012 |
| JP | 2013057095 A | 3/2013 |
| JP | 2013216933 A | 10/2013 |
| JP | 2015007283 A | 1/2015 |
| JP | 5688664 B2 | 3/2015 |
| JP | 5781408 B2 | 9/2015 |
| KR | 20120049552 A | 5/2012 |
| KR | 20120049554 A | 5/2012 |
| WO | 2012066079 A1 | 5/2012 |
| WO | 2012133704 A1 | 10/2012 |

OTHER PUBLICATIONS

Kadokura, "Thin Film Formation by using New Facing Targets Sputtering Apparatus," J. Vac. Soc. Jpn., vol. 4(9), 2001, pp. 808-814.

Takazawa et al., "Properties of the ITO film formed by a facing targets sputtering method," ULVAC Technical Journal No. 64 2006, pp. 18-22.

Written Opinion dated Apr. 11, 2017 for International Patent Application No. PCT/JP2017/002463.

Yasuda et al., "Laser spectroscopy of Ar I and Ti I in plasma produced by a facing target sputtering system," Journal of the department of engineering of Tokyo Polytechnic University, vol. 30(1), 2007, pp. 51-58.

* cited by examiner

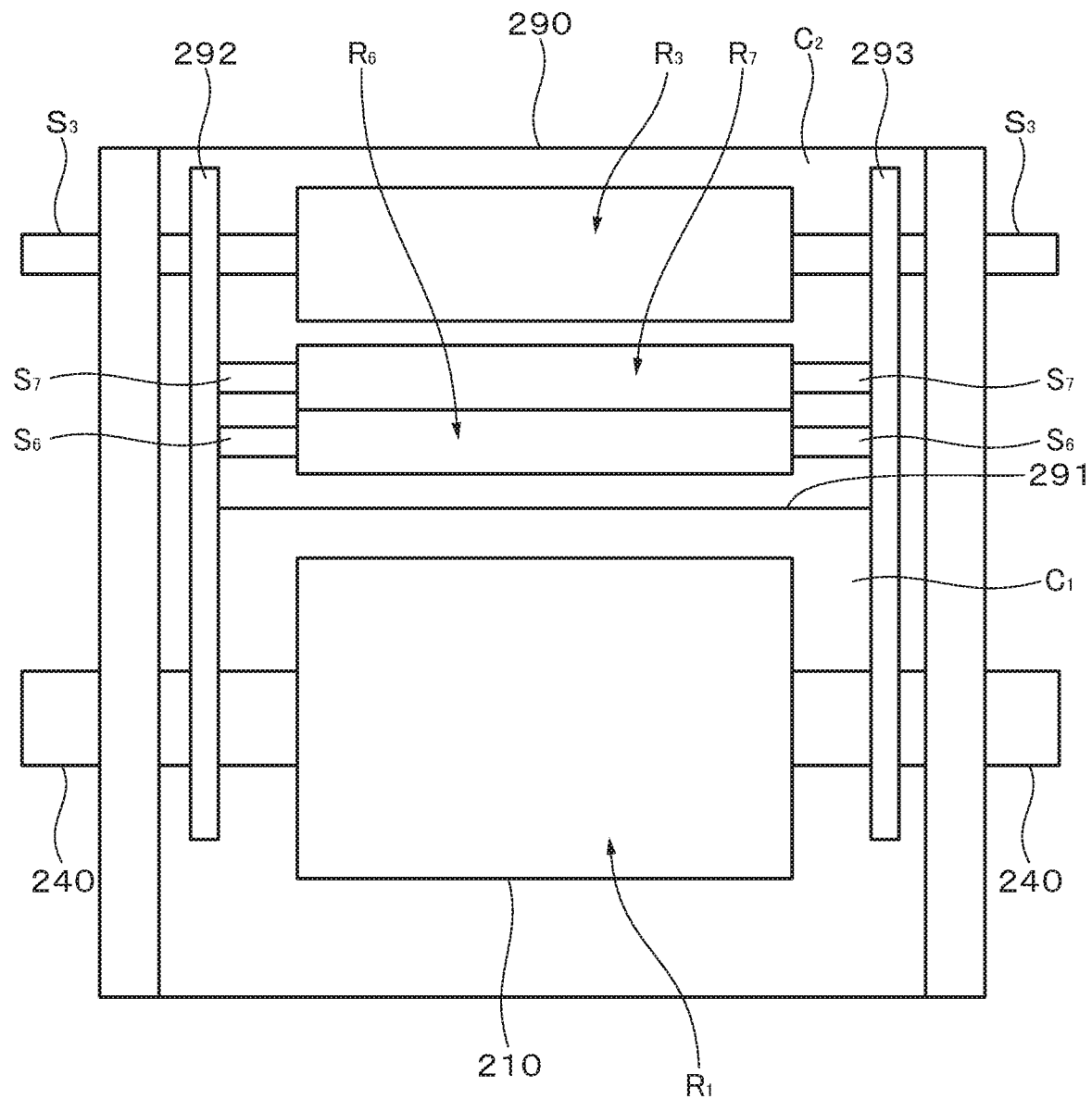

SPUTTERING CATHODE, SPUTTERING DEVICE, AND METHOD FOR PRODUCING FILM-FORMED BODY

CROSS-REFERENCE TO RELATED APPLICATIONS

This application is a continuation of U.S. application Ser. No. 15/735,847 filed Dec. 12, 2017, the contents of which are incorporated by reference and all benefits of which are claimed. That application, in turn, was a National Stage Entry of PCT/JP2017/002463 filed Jan. 25, 2017, the contents of which are incorporated by reference and all benefits of which are claimed. The PCT application is based on JP 2016-067068 filed Mar. 30, 2016 and 2016-168705 filed Aug. 31, 2016, the contents of both of which are incorporated by reference and all benefits of both of which are claimed.

BACKGROUND OF THE INVENTION

Technical Field

This invention relates to a sputtering cathode, a sputtering device, and a method for producing a film-formed body, which are suitably applied to make various devices in which thin films are formed by a sputtering method.

Background Art

Heretofore, in steps for forming electrodes in various devices such as semiconductor devices, solar batteries, liquid crystal displays, organic ELs, vacuum evaporation devices have been used to deposit electrode materials. However, a vacuum evaporation method has difficulties in controlling distribution of film thickness spatially and in time. Therefore, deposition of electrode materials by a sputtering method is desired.

Heretofore, as sputtering devices, a parallel-plate, magnetron sputtering device, an RF sputtering device, a facing targets sputtering device, etc. have been known. Among them, in the facing targets sputtering device, two circular or square or rectangular targets made of the same materials having the same size are faced parallel to each other and film formation is performed by sputtering the targets by introducing a sputtering gas into a space between the targets and performing discharge (for example, see non-patent literatures 1~3). It is said that the facing targets sputtering device can perform high vacuum, low voltage discharge by restricting a plasma in a space between the two targets, which can stand comparison with plasma restriction in the magnetron sputtering device, and realize generation of sputtering particles, and further prevent a neutral reflected process gas from bombarding the surface of a substrate to be film-formed by restricting the plasma with formation of magnetic field in the plasma space.

On the other hand, another spettering device has been known (see patent literature 1). In the sputtering device, a ringlike sputtering target is used, a string or cylindrical body to be film-formed is moved in the axial direction of a sputtering space inside the ringlike sputtering target, or the body to be film-formed is fixed in the axial direction in the sputtering space and film formation is performed on the body to be film-formed by performing sputtering.

PRIOR ART LITERATURE

Patent Literature

[PATENT LITERATURE 1] Laid-open patent gazette 2009-256698
[PATENT LITERATURE 2] Gazette of U.S. Pat. No. 5,102,470

Non-Patent Literature

[NON-PATENT LITERATURE 1] J. Vac. Soc. Jpn. Vol. 44, No. 9, 2001, pp. 808-814
[NON-PATENT LITERATURE 2] Journal of the department of engineering of Tokyo Polytechnic University, Vol. 30 No. 1 (2007) pp. 51-58
[NON-PATENT LITERATURE 3] ULVAC TECHNICAL JOURNAL No. 64 2006, pp. 18-22

SUMMARY OF THE INVENTION

Subjects to be Solved by Invention

However, the facing targets sputtering device described above has a drawback that the plasma density between the facing two targets is low and sufficiently high deposition rate cannot be obtained.

On the other hand, the sputtering device proposed in patent literature 1 has a drawback that it is difficult to perform film formation on a flat boardlike body to be film-formed.

Therefore, the subject to be solved by the invention is to provide a sputtering cathode, a sputtering device, and a method for producing a film-formed body which can perform film formation on a flat boardlike or filmlike body to be film-formed at a sufficiently high deposition rate and with low bombardment.

Means to Solve the Subjects

To solve the above subject, according to the invention, there is provided a sputtering cathode, comprising:
a sputtering target having a tubular shape in which the cross-sectional shape thereof has a pair of long side sections facing each other, an erosion surface facing inward.

Further, according to the invention, there is provided a sputtering device, comprising:
a sputtering cathode, comprising a sputtering target having a tubular shape in which the cross-sectional shape thereof has a pair of long side sections facing each other, an erosion surface facing inward; and
an anode disposed such that the erosion surface of the sputtering target is exposed,
wherein while moving a body to be film-formed having a film formation region having a narrower width than the long side sections of the sputtering target in a direction traversing the long side sections of the sputtering target for the sputtering target at a constant speed above a space surrounded by the sputtering target, discharge is performed such that a plasma circulating along the inner surface of the sputtering target is generated, and the inner surface of the long side sections of the sputtering target is sputtered by ions in the plasma generated by a sputtering gas to perform film formation in the film formation region of the body to be film-formed.

Further, according to the invention, there is provided a method for producing a film-formed body, comprising:

using a sputtering cathode, comprising: a sputtering target having a tubular shape in which the cross-sectional shape thereof has a pair of long side sections facing each other, an erosion surface facing inward, performing discharge such that a plasma circulating along the inner surface of the sputtering target is generated, and the inner surface of the long side sections of the sputtering target is sputtered by ions in the plasma generated by a sputtering gas to perform film formation in a film formation region having a narrower width than the long side sections of the sputtering target of a body to be film-formed while moving the body to be film-formed in a direction traversing the long side sections of the sputtering target for the sputtering target at a constant speed above a space surrounded by the sputtering target.

In the inventions, typically, the distance between the pair of long side sections facing each other of the sputtering target is preferably not less than 50 mm and not larger than 150 mm, more preferably not less than 60 mm and not larger than 100 mm, most preferably not less than 70 mm and not larger than 90 mm in order to obtain the sufficient number of sputtered particles going toward a space above the sputtering target and to prevent light generated from the plasma generated near the surface of the sputtering target from irradiating the body to be film-formed which moves in the space above the sputtering target, when the sputtering cathode is attached to the sputtering device and used. Furthermore, the ratio of the length of the long side section to the distance between the pairs of long side sections of the sputtering target is typically not less than 2 and preferably not less than 5. Although there is no upper limit of the ratio, the ratio is generally not larger than 40.

The pair of the long side sections of the sputtering target are typically parallel to each other, but not limited to this and they may slant each other. The cross-sectional shape of the sputtering target typically has the pair of long side sections which are parallel to each other and a pair of short side sections facing each other perpendicular to the long side sections. In this case, the sputtering target has a shape like a rectangular pipe having the rectangular cross-sectional shape. The cross-sectional shape of the sputtering target may have both ends in a direction parallel to the long side sections composed of a pair of outwardly convex curved sections (for example, semicircular sections) facing each other. The sputtering target having the shape like a rectangular pipe having the rectangular cross-sectional shape typically comprises a first flat board and a second flat board forming the pair of long side sections and a third flat board and a fourth flat board forming the pair of short side sections facing each other perpendicular to the long side sections. In this case, the sputtering target can be assembled by separately making the first to fourth flat boards and arranging them like a rectangular pipe. The first flat board and the second flat board forming the pair of long side sections are generally made of materials with the same composition as materials to be deposited, but may be composed of materials different from each other. For example, the first flat board is made of material A and the second flat board is made of material B. And by applying a beam of sputtered particles from the first flat board and a beam of sputtered particles from the second flat board to the body to be film-formed, a thin film composed of A and B can be formed. If necessary, by using two or more components material as materials A and B, a thin film made of multicomponent materials can be formed. More specifically, for example, by making the first flat board of metal $M_1$ composed of single element and making the second flat board of metal $M_2$ composed of single element, a binary alloy thin film composed of $M_1$ and $M_2$ can be formed. This means that a film formation method similar to a binary evaporation method in a vacuum evaporation method can be realized by the sputtering device. Furthermore, it is possible to form a two-layer structure thin film made of a thin film composed of A and a thin film composed of B formed thereon as follows. That is, for example, a shield plate, which is capable of inserting and pulling out, is inserted between the body to be film-formed and the sputtering target, so that, for example, the beam of sputtered particles from the second flat board is shielded. And by applying the beam of sputtered particles from the first flat board to the body to be film-formed while the body is moved, the thin film composed of A is first formed on the body to be film-formed. Then the beam of sputtered particles from the first flat board is shielded. And by applying the beam of sputterd particles from the second flat board to the body to be film-formed while the body to be film-formed is moved in the reverse direction, the thin film composed of B is formed on the body to be film-formed.

Generally, the beam of sputtered particles from sections of the sputtering target except the pair of long side sections is not positively used for film formation. However, in order to prevent unintentional elements from mixing, the sections of the sputtering target except the pair of long side sections are typically made of similar materials as the long side sections. However, when the beam of sputtered particles from the sections of the sputtering target except the pair of long side sections are positively used for film formation, the sections of the sputtering target except the pair of long side sections may be made of materials different from the pair of long side sections.

It is possible to obtain the beam of sputtered particles from the sputtering target not only above the space surrounded by the sputtering target but also below the space. Therefore, if necessary, it is possible to move another body to be film-formed below the space surrounded by the sputtering target for the sputtering target at a constant speed in a direction traversing the long side sections of the sputtering target and form a film in the film formation region of the body to be film-formed during that time.

By the way, heretofore, in a sputtering device in which film formation is performed on a film by a roll-to roll method, a film formation roller (also called a main roller) is disposed in a deposition chamber and a pair of rollers for unwinding/winding is disposed in a film carrying chamber which is disposed separately from the deposition chamber. And while a film is unwound from one roller of the pair of rollers and the film is wound by the other roller through the film formation roller, film formation is performed on the film wound by the film formation roller. The film formation roller which has been generally used heretofore is formed by a cylindrical stainless steel plate. Another cylindrical stainless steel plate is disposed inside the cylindrical stainless steel plate. And cooling water is poured into a space between the double stainless steel plate, so that the film formation roller can be cooled. However, since the film formation roller has a structure in which pressure by cooling water is applied to the whole inner surface of the outer cylindrical stainless steel plate, it has drawbacks that the outer cylindrical stainless steel plate is deformed like a beer barrel in vacuum and therefore not only the surface of the film is curved but also the film cannot be carried smoothly.

The drawbacks can be eliminated by using a film formation roller having a cylindrical section made of copper, copper alloy, aluminum or aluminum alloy having a built-in flow passage at least in an effective section thereof as the film formation roller around which a body to be film-formed on which film formation is performed by a roll-to-roll method is wound. Here, the effective section of the film formation roller means the section around which the body to be film-formed is wound and with which the body to be film-formed comes in contact. The body to be film-formed may be anything and not limited particulary as far as it can be wound around the effective section of the film formation roller. Specifically, the body to be film-formed is, for example, a film, a sheet, a clothlike body composed of fibers, etc. and its material may be various materials such as resins, metal materials (iron-based materials and nonferrous materials) such as single metal, alloy, etc. When the cylindrical section is made of copper or copper alloy, if thermal conductivity and workability are regarded as most important, the cylindrical section is preferably made of copper (pure copper) (for example, oxygen-free copper, tough pitch copper, phosphorus deoxidized copper, etc.) having high thermal conductivity and high ductility, most preferably oxygen-free copper. On the other hand, the cylindrical section is made of copper alloy when characteristics which cannot be obtained by copper (for example, mechanical strength higher than that of copper) are necessary. As copper alloy, copper-tin based alloy, copper-zinc based alloy, copper-nickel based alloy, copper-aluminum based alloy, copper-beryllium based alloy, etc. are exemplified, and alloy and its composition satisfying characteristics demanded for the cylindrical section are selected among them. Furthermore, when the cylindrical section is made of aluminum or aluminum alloy, if thermal conductivity and workability are regarded as most important, the cylindrical section is preferably made of aluminum (pure aluminum) having high thermal conductivity and high ductility. On the ther hand, the cylindrical section is made of aluminum alloy when characteristics which cannot be obtained by aluminum (for example, mechanical strength higher than that of aluminum) are necessary. As aluminum alloy, aluminum-copper-magnesium based alloy, aluminum-manganese based alloy, aluminum-silicon based alloy, aluminum-magnesium based alloy, aluminum-magnesium-silicon based alloy, aluminum-zinc-magnesium based alloy, etc. are exemplified, and alloy and its composition satisfying characteristics demanded for the cylindrical section are selected among them. By making the cylindrical section of copper, copper alloy, aluminum or aluminum alloy, it is possible to obtain thermal conductivity higher than that of stainless steel at least. For example, thermal conductivity of stainless steel is 16.7 W/(m·K) for SUS304 and SUS316 and 26.0 W/(m·K) for SUS444. In contrast with this, thermal conductivity of copper is 391 W/(m·K) for oxygen-free copper (C1020) and tough pitch copper (C1100) and 339 W/(m·K) for phosphorus deoxidized copper. Thermal conductivity of copper alloy is 121 W/(m·K) for class 1 brass which is copper-zinc based alloy, 33 W/(m·K) for class 2 nickel silver which is copper-nickel based alloy, 84 W/(m·K) for class 1 phosphor bronze which is copper-tin based alloy, 210 W/(m·K) for copper-nickel-silicon alloy (Corson alloy) which is copper-nickel based alloy, for example, EFTEC23Z. Thermal conductivity of aluminum is 220 W/(m·K) for A1100. Thermal conductivity of aluminum alloy is 190 W/(m·K) for A2017 which is aluminum-copper-magnesium based alloy, 190 W/(m·K) for A3003 which is aluminum-magnesium based alloy, 150 W/(m·K) for A4032 which is aluminum-silicon based alloy, 200 W/(m·K) for A5005 which is aluminum-magnesium based alloy, 220 W/(m·K) for A6063 which is aluminum-magnesium-silicon based alloy, and 130 W/(m·K) for A7075 which is aluminum-zinc-magnesium based alloy. Above thermal conductivity of copper, copper alloy, aluminum and aluminum alloy is higher than that of stainless steel.

Preferably, formed on at least the outer peripheral surface of the cylindrical section made of copper, copper alloy, aluminum or aluminum alloy is a coating layer made of material having hardness higher than that of copper, copper alloy, aluminum or aluminum alloy forming the cylindrical section. For example, plating of material with hardness higher than that of copper, copper alloy, aluminum or aluminum alloy, preferably hard chromium is performed on the surface of the cylindrical section. The thickness of the coating layer or plating layer is selected so as not to lower thermal conductivity of the surface of the cylindrical section.

Fluid such as liquid or gas is poured into the flow passage built in the cylindrical section, and what fluid is poured is determined appropriately according to kind of material forming the cylindrical section etc. Water, oil, alternative chlorofluorocarbon (hydro fluorocarbon (HFC)), air, etc. are exemplified as fluid. The flow passage built in the cylindrical section typically has a zigzag folded shape having a section elongating linearly in the circumferential direction of the cylindrical section (when the cylindrical section is expanded in a plane, it becomes a linear part) and a turn back section. The cross-sectional shape of the flow passage is not particularly limited and appropriately selected. The cross-sectional shape of the flow passage is preferably a rectangular cross-sectional shape parallel to the central axis of the cylindrical section. In more detail, the cylindrical section is preferably formed by a cylinder made by rounding a flat board having a rectangular or square planar shape in a direction parallel to one side of the flat board (a direction parallel to the linear part or the vertical direction to the linear part of the flow passage when the cylindrical section is expanded in a plane) and joining one end and the other end of the rounded board, the flat board being formed by a first flat board having the same rectangular or square planar shape as a planar shape obtained by expanding the cylindrical section in a plane, a groove comprising a lower groove having the same planar shape as the flow passage obtained by expanding the cylindrical section in a plane and an upper groove larger than the lower groove having a planar shape almost similar to the lower groove being provided on one major surface of the first flat board and a second flat board put in the upper groove of the groove of the first flat board, a boundary section of the first flat board and the second flat board being joined by friction stir welding. When the flat board is rounded like a cylinder in the direction parallel to its one side, the surface of the flat board on the side of the boundary section between the first flat board and the second flat board joined by friction stir welding may face outward or inward. When the flat board is rounded like a cylinder, a prop for supporting the second flat board put in the upper groove of the groove of the first flat board may be formed inside the lower groove in order to prevent that the lower groove, which finally forms the flow passage, becomes deformed and the flow passage having the cross-sectional shape as designed cannot be obtained. With this, since the prop supports the second flat board for the lower groove when the flat board is rounded like a cylinder, it is possible to prevent the lower groove from deforming. The prop may be formed at at least one place, typically several places, or formed like a line or points along the whole lower groove depending on the situation in the elongation direction of the lower groove. The width of the prop is preferably selected to be sufficiently small compared with the width of the lower groove so as not to reduce the area of the cross section of the lower groove too much. The prop may be formed as one body with the first flat board or the second flat board, or may be formed separately from the first flat board and the second flat board. Friction stir welding is a solid phase welding using friction heat and plastic flow. According to friction stir welding, a welding tool is inserted into material and the welding tool is moved along the welding line while the welding tool is rotated, so that the material is softened by friction heat generated between the welding tool and the material and stirred by the welding tool and finally welded (for example, see patent literature 2.). Crystalline structure obtained by the friction stir welding becomes more fine compared with that before welding, and ductility in a direction along the welding line is improved. Therefore, since the flat board having the rectangular or square planar shape in which the boundary section between the first flat board and the second flat board is joined by friction stir welding has good ductility in the direction of the boundary section, it is possible to easily round the flat board in the direction of the boundary section so that the surface of the flat board on the side of the boundary section of the first flat board and the second flat board joined by friction stir welding faces outward without resulting breakdown or damage of the boundary section of the first flat board and the second flat board. The flow passage built in the cylindrical section is not limited to the flow passage having the zigzag folded shape having a section elongating linearly in the circumferential direction of the cylindrical section and a turn back section and may be, for example, a flow passage having a zigzag folded shape having a section elongating in a direction parallel to the central axis of the cylindrical section and a turn back section. Furthermore, the flow passage built in the cylindrical section may be flow passages formed between both ends of the cylindrical section parallel to the central axis of the cylindrical section and at a plurality of places in equal intervals in the circumferential direction of the cylindrical section. Such flow passages can be formed by, for example, rounding a flat board having the same rectangular or square planar shape as the planar shape obtained by expanding the cylindrical section in a plane in a direction parallel to one side of the flat board like a cylinder, joining one end and the other end of the rounded board and forming throughholes extending from one end to the other end of the rounded board. The cross-sectional shape of the flow passages in this case is not particularly limited, and is a circle when the throughholes are formed by, for example, gun drilling.

Typically, a circular board is attached to each end of the cylindrical board such as to close the cylindrical section and each circular board has throughholes communicating the inside and the outside of the cylindrical section. With this, when the film formation roller is disposed in the deposition chamber and the deposition chamber is evacuated, it is possible to equalize pressure of the inside and the outside of the cylindrical section to prevent the cylindrical section from being deformed by application of external force. Material forming the circular board is selected appropriately and, for example, stainless steel. In order to obtain symmetry of weight distribution around the central axis of the film formation roller and rotate the film formation roller smoothly, the throughholes of the circular board are preferably arranged symmetrically around the central axis of the circular board. Typically, a shaft is attached to the outside of each circular board on the central axis of the film formation roller, therefore the cylindrical section. Supply of fluid into the flow passage built in the cylindrical section is performed, for example, as follows. That is, a first throughhole is formed on the central axis of one shaft so as to go through the shaft and one circular board, a second throughhole is formed on the central axis of the other shaft so as to go through the other shaft and the other circular board, one end of a first pipe is hermerically fixed inside the cylindrical section so as to communicate with the first throughhole, the other end of the first pipe is hermetically connected with a hole formed on one end part of the flow passage built in the cylindrical section on the side of the one circular board so as to communicate with the flow passage, one end of a second pipe is hermetically fixed inside the cylindrical section so as to communicate with the second throughhole and the other end of the second pipe is hermetically connected with a hole formed on the other end of the flow passage built in the cylindrical section on the side of the other circular board so as to communicate with the flow passage. And fluid is supplied from the outside through the first throughhole of the one shaft. Fluid is then supplied through the first pipe to one end of the flow passage built in the cylindrical section. And fluid is discharged to the outside from the second throughhole of the other shaft through the other end of the flow passage and the second pipe connected with the other end. In this way, fluid circulates in the flow passage. Or, a third throughhole is formed on the central axis of one shaft so as to go through the one shaft, a fourth throughhole is formed on the central axis of the other shaft so as to go through the other shaft, a flow passage is formed inside the one circular board so as to communicate with the third throughhole, the flow passage communicates with one end part of the flow passage built in the cylindrical section on the side of the other circular board, a flow passage is formed inside the other circular board so as to communicate with the fourth throughhole and the flow passage communicates with the other end part of the flow passage built in the cylindrical section on the side of the other circular board. And, fluid is supplied from the outside through the third throughhole of one shaft. Fluid is then supplied through the flow passage built in one circular board to one end of the flow passage built in the cylindrical section. And fluid is discharged to the outside from the fourth throughhole of the other shaft through the other end of the flow passage and the flow passage built in the other circular board connected with the other end. In this way, fluid circulates in the flow passage.

Outside diameter, inside diameter and length of the cylindrical section, the cross-sectional shape, size of the cross section and intervals of the flow passage built in the cylindrical section, etc. are appropriately selected according to purpose of use of the film formation roller etc.

When a film is formed on a film, more generally, a body to be film-formed by a roll-to-roll method in the sputtering device using the film formation roller described above, it is possible to carry the body to be film-formed smoothly while the surface of the body to be film-formed is kept flat and control temperature of the body to be film-formed promptly and accurately, thereby performing good film formation.

Preferably, the film formation roller around which the body to be film-formed on which film formation is performed by a roll-to-roll method is wound, having the cylindrical section made of copper, copper alloy, aluminum and aluminum alloy having the built-in flow passage at least in the effective section of the film formation roller can be easily made by following two making methods.

A first method for making a film formation roller, comprising steps of:

using a first flat board having the same rectangular or square planar shape as a planar shape obtained by expanding the cylindrical section in a plane, a groove comprising a lower groove having the same planar shape as the flow passage obtained by expanding the cylindrical section in a plane and an upper groove larger than the lower groove, having a planar shape almost similar to the lower groove being provided on one major surface of the first flat board and putting a second flat board in the upper groove of the groove of the first flat board, joining a boundary section of the first flat board and the second flat board by friction stir welding; and rounding a flat board having a rectangular or square planar shape, which is formed by the first flat board and the second flat board, the boundary section of the first flat board and the second flat board being joined by friction stir welding, in a direction parallel to one side of the flat board and joining one end and the other end of the rounded board.

A second method for making the film formation roller comprises steps of:

rounding a flat board having the same rectangular or square planar shape as a planar shape obtained by expanding the cylindrical section in a plane in a direction parallel to one side of the flat board like a cylinder and joining one end and the other end of the rounded board; and forming the flow passage by forming throughholes extending from one end to the other end of the rounded board at a plurality of places in equal intervals in the circumferential direction of the rounded board parallel to the central axis of the rounded board.

The first flat board and the second flat board are made of material as the same as material forming the cylindrical section, which is copper, copper alloy, aluminum or aluminum alloy. In these methods for making the film formation roller, other than the above, the explanation mentioned above in connection with the film formation roller comes into effect unless it is contrary to its character.

Effect of the Invention

According to the invention, since the sputtering target of the sputtering cathode has a tubular shape having the cross-sectional shape having a pair of long side sections facing each other, that is, a shape surrounded in all directions and an erosion surface faces inward, when the sputtering cathode is attached to a sputtering device and discharge is performed, it is possible to generate a plasma circulating along the inner surface of the sputtering target on the side of the erosion surface of the sputtering target. Therefore, it is possible to increase plasma density and obtain suffifiently high deposition rate. Furthermore, the place where much plasma is generated is limited to the vicinity of the surface of the sputtering target, it is possible to lower risk of causing damage of the body to be film-formed from irradiation of light emitted from the plasma to a minimum.

Furthermore, especially in a sputtering device in which film formation is performed by a roll-to-roll method, by using the film formation roller having the cylindrical section made of copper, copper alloy, aluminum or aluminum alloy having the built-in flow passage at least in the effective section of the film formation roller as the film formation roller around which the body to be film-formed on which film formation is performed is wound, it is possible not only to cool or heat the cylindrical section promptly and effectively by pouring, for example, cooling water or hot water into the flow passage built in the cylindrical section because copper, copper alloy, aluminum and aluminum alloy has high thermal conductivity but also to avoid the problem that the film formation roller is deformed like a beer barrel in vacuum such as the conventional film formation roller described above. Therefore, when a film is formed on the body to be film-fomred by a roll-to-roll method in the sputtering device, it is possible to carry the film smoothly while the surface of the body to be film-formed is kept flat. In addition, since the cylindrical section made of copper, copper alloy, aluminum or aluminum alloy having high thermal conductivity responds to heat quickly, it is possible to control temperature of the cylindrical section promptly and accurately by temperature, flow rate, etc. of, for example, cooling water or hot water poured into the flow passage and finally control temperature of the body to be film-formed wound around the cylindrical section promptly and accurately.

BRIEF DESCRIPTION OF THE DRAWINGS

FIG. 23 A schematic view showing the sputtering device according to the sixth embodiment of the invention.

MODES FOR CARRYING OUT THE INVENTION

Modes for carrying out the invention (hereinafter referred as "embodiments") will now be explained below.

The First Embodiment

[Sputtering Device]

Figure 1:
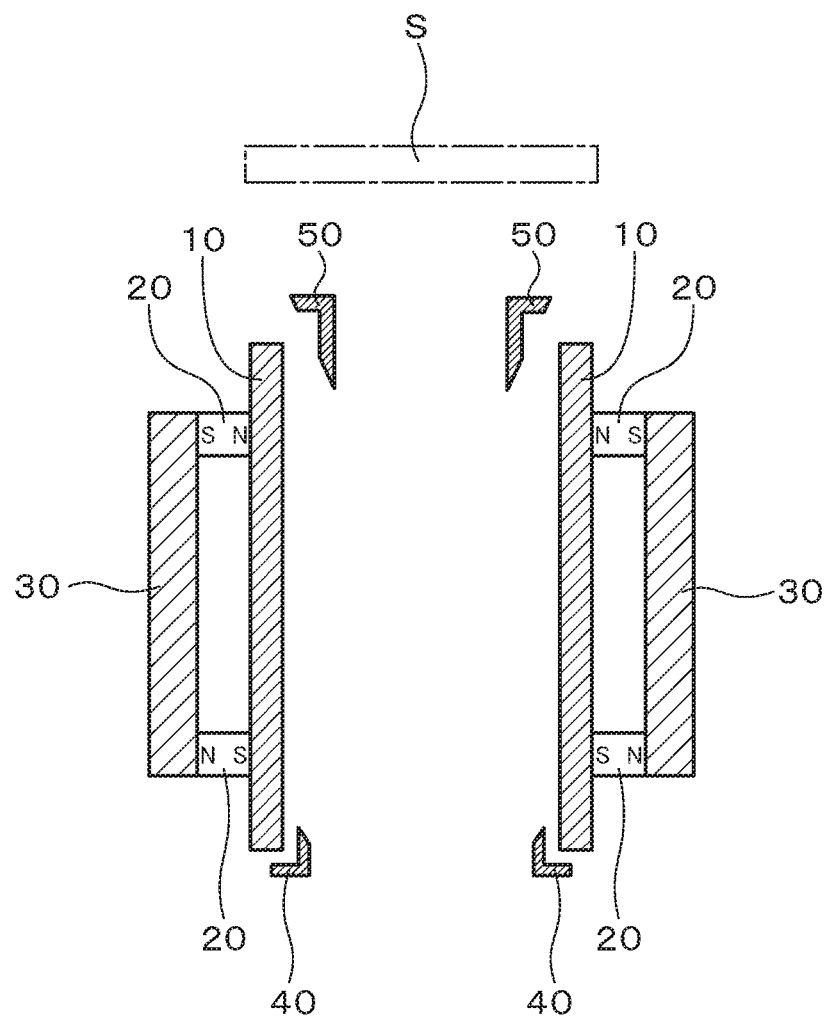
FIG. 1 A longitudinal cross-sectional view showing a sputtering device according to a first embodiment of the invention.
Figure 2:
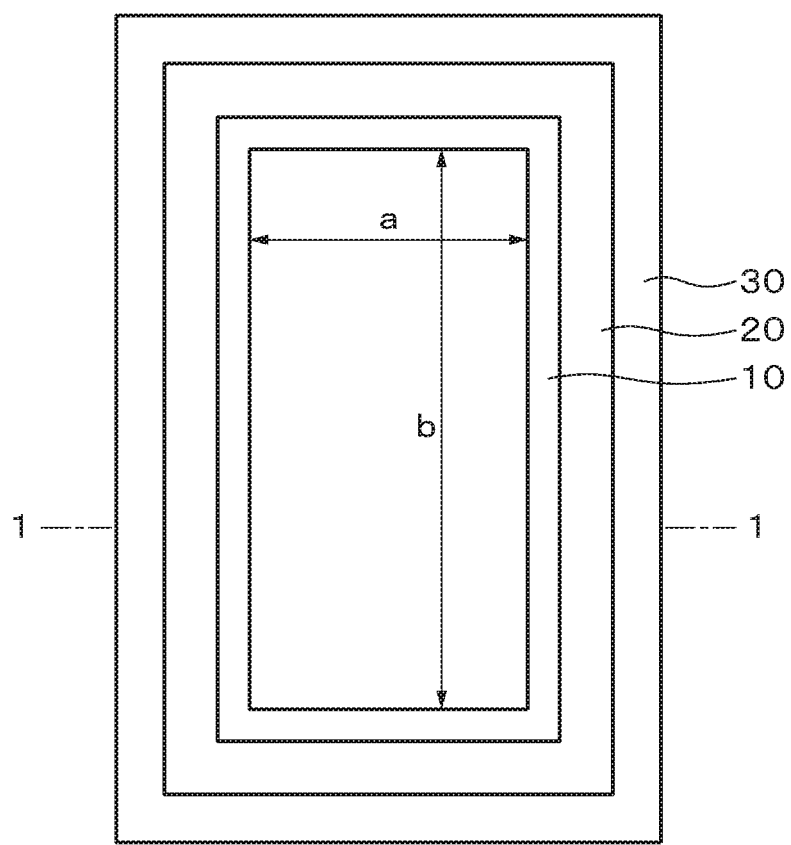
FIG. 2 A plan view showing a sputtering cathode of the sputtering device according to the first embodiment of the invention.

FIG. 1 and FIG. 2 are a longitudinal cross-sectional view and a plan view showing the sputtering device according to the first embodiment and show construction around a sputtering cathode and an anode disposed inside a vacuum chamber of the sputtering device. FIG. 1 is a cross-sectional view along the line 1-1 of FIG. 2.

As shown in FIG. 1 and FIG. 2, the sputtering device comprises a sputtering target 10 having a rectangular tubular shape in which the cross-sectional shape thereof is a rectangular, and an erosion surface faces inward, a permanent magnet 20 disposed outside the sputtering target 10 and a yoke 30 disposed outside the permanent magnet 20. The sputtering target 10, the permanent magnet 20 and the yoke 30 form the sputtering cathode. The sputtering cathode is generally fixed to the vacuum chamber in an electrically isolated state. The permanent magnet 20 and the yoke 30 form a magnet circuit. Although polarity of the permanent magnet 20 is as shown in FIG. 1, opposite polarity may be used. A backing plate for cooling is preferably disposed between the sputtering target 10 and the permanent magnet 20, and for example cooling water is poured into a flow passage formed inside the backing plate. An anode 40 having an L-shaped cross-sectional shape is disposed near the lower end of a rectangular parallelepiped space surrounded by the sputtering target 10 such that the erosion surface of the sputtering target 10 is exposed. The anode 40 is generally connected with the vacuum chamber put to earth. A light stopping shield 50 having an L-shape cross-sectional shape is disposed near the upper end of the rectangular parallelpiped space surrounded by the sputtering target 10 such that the erosion surface of the sputtering target 10 is exposed. The light stopping shield 50 is made of electric conductor, typically metal. The light stopping shield 50 serves also as the anode and is generally connected with the vacuum chamber put to earth as the same as the anode 40.

As shown in FIG. 2, when the distance between the pair of long side sections facing each other of the sputtering target 10 is denoted as a and the distance between the pair of short side sections facing each other of the sputtering target 10 is denoted as b, b/a is selected to be not less than 2, generally not larger than 40. a is generally selected to be not less than 50 mm and not larger than 150 mm.

In the sputtering device, film formation is performed for a substrate A (a body to be film-formed) held by a prescribed carrying mechanism not illustrated above the space surrounded by the sputtering target 10. Film formation is performed while the substrate S is moved for the sputtering target 10 at a constant speed in the direction traversing the long side sections of the sputtering target 10. In FIG. 1, shown is as an example a case where the substrate S is moved at a constant speed parallel to the upper end surface of the sputtering target 10 in the direction perpendicular to the long side sections of the sputtering target 10. Width of a film formation region of the substrate S in the direction parallel to the long side sections of the sputtering target 10 is selected to be less than b, and therefore the substrate S is held between the pair of short side sections facing each other of the sputtering target 10 when film formation is performed. The width of the film formation region of the substrate S is equal to the width of the substrate S when film formation is performed on the whole surface of the substrate S. The substrate S may be basically anything and is not particularly limited. The substrate S may be a long film wound around a roller which is used for a roll-to-roll process.

[Method for Forming a Film by the Sputtering Device]

Figure 3:
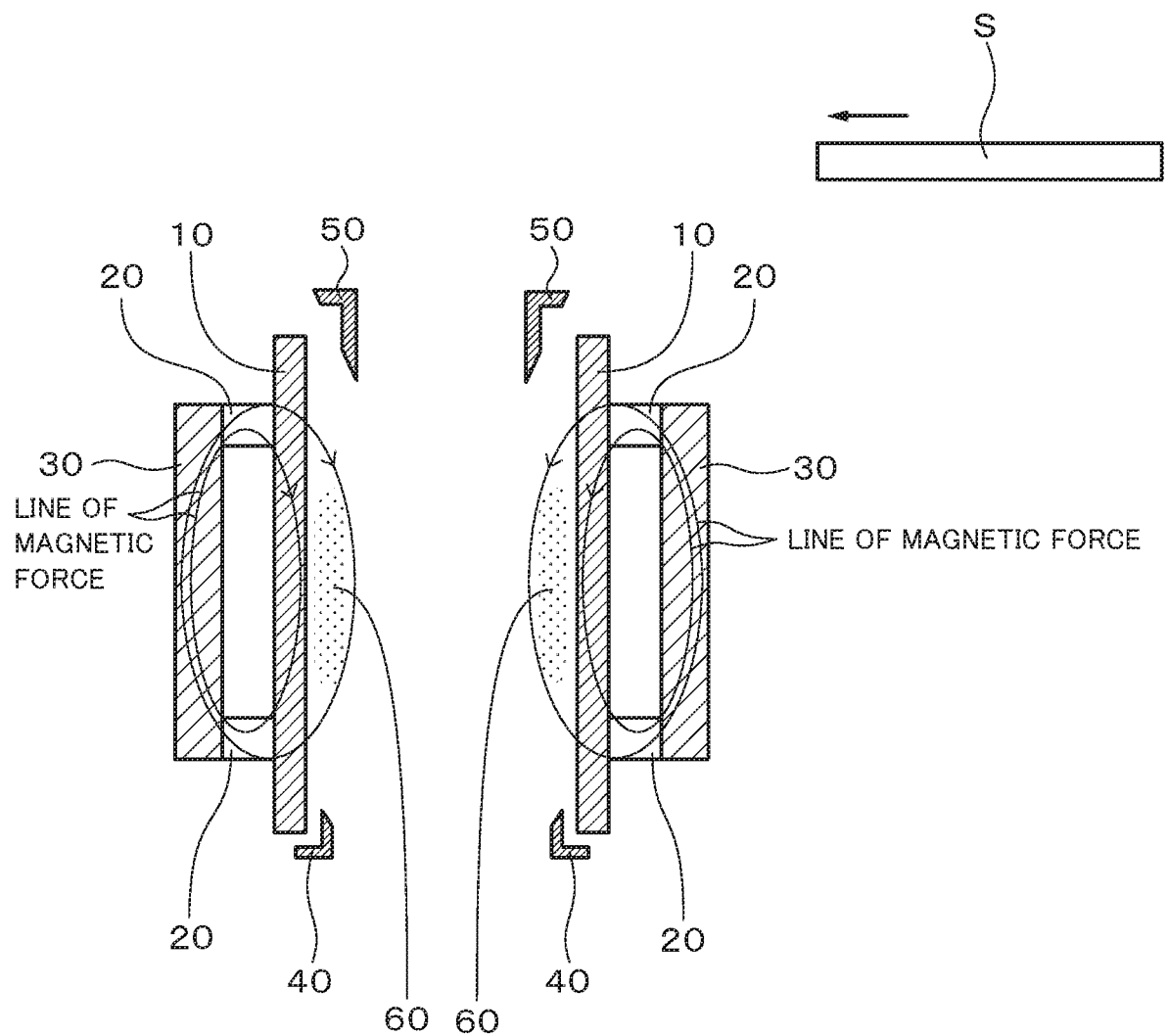
FIG. 3 A longitudinal cross-sectional view showing a state where a plasma is generated near the surface of the sputtering target in the sputtering device according to the first embodiment of the invention.
Figure 4:
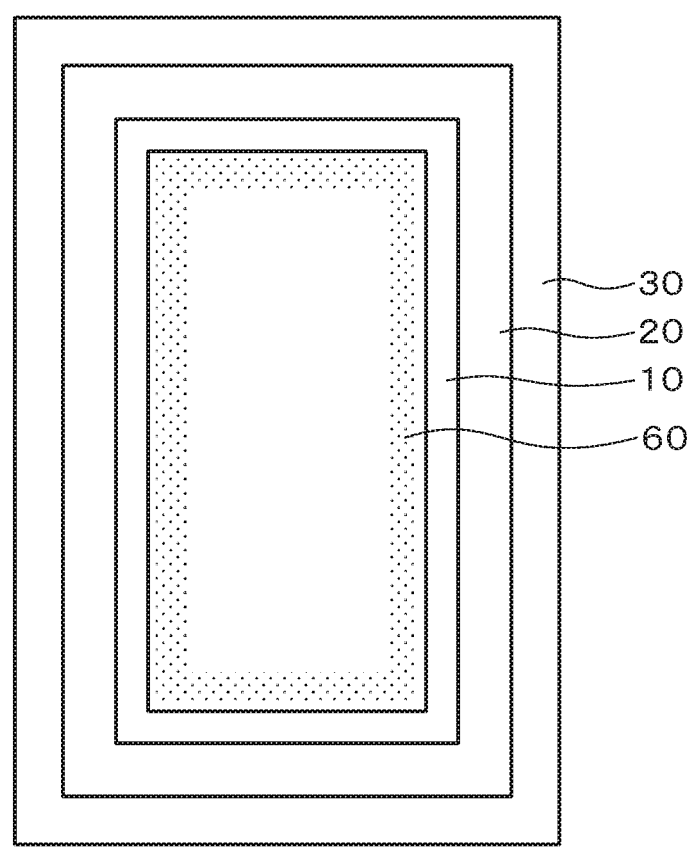
FIG. 4 A plan view showing a state where the plasma is generated near the surface of the sputtering target in the sputtering device according to the first embodiment of the invention.

After the vacuum chamber is evacuated to high vacuum by vacuum pumps, an Ar gas is introduced into the space surrounded by the sputtering target 10 as a sputtering gas. Thereafter, high voltage, generally DC high voltage necessary to generate a plasm is applied between the anode 40 and the sputtering cathode by a prescribed power source. Generally, the anode 40 is put to earth and negative high voltage (for example, −400V) is applied to the sputtering cathode. With this, as shown in FIG. 3 and FIG. 4, a plasma 60 circulating along the inner surface of the sputtering target 10 is generated near the surface of the sputtering target 10.

Before film formation, the substrate S is located far from a position above the space surrounded by the sputtering target 10.

Figure 5:
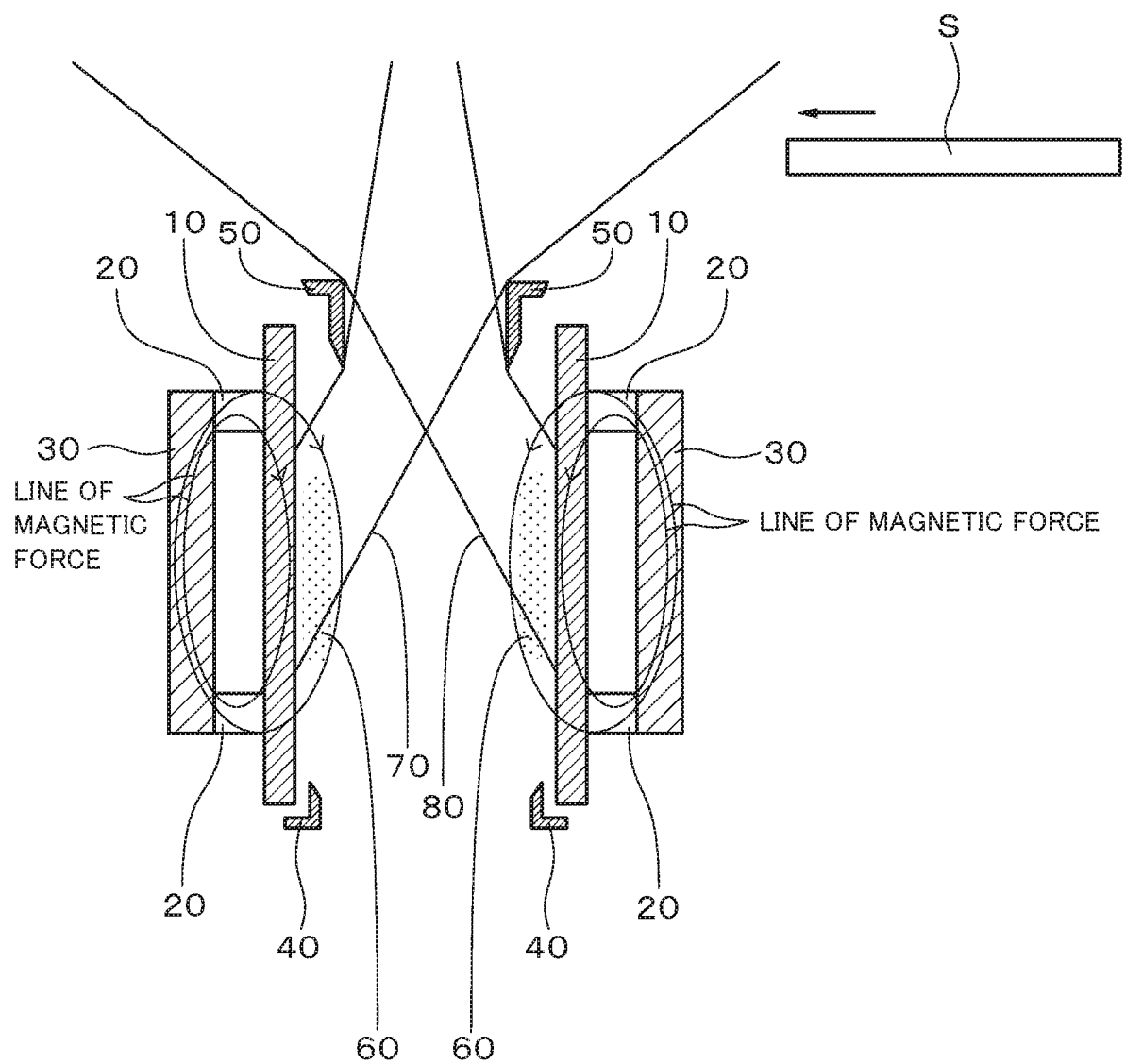
FIG. 5 A longitudinal cross-sectional view showing a method for forming a thin film on a substrate by the sputtering device according to the first embodiment of the invention.

The sputtering target 10 is sputtered by Ar ions in the plasma 60 circulating along the inner surface of the sputtering target 10. As a result, atoms constituting the sputtering target 10 are emitted upward from the space surrounded by the sputtering target 10. In this case, although atoms are emitted from everywhere near the plasma 60 of the erosion surface of the sputtering target 10, atoms emitted from the erosion surface of the short side sections of the sputtering target 10 are not basically used for film formation. A way to accomplish this is to prevent atoms emitted from the erosion surface of the short side sections of the sputtering target 10 from reaching the substrate S during film formation by disposing a horizontal shield plate above the sputtering target 10 so as to shield both ends of the sputtering target 10 in the long side direction. Alternatively, it is possible to prevent atoms emitted from the erosion surface of the short side sections of the sputtering target 10 from reaching the substrate S during film formation by setting the width b of the sputtering target 10 in the longitudinal direction sufficiently larger than the width of the substrate S. A part of the atoms emitted from the sputtering target 10 is shielded by the light stopping shield 50. As a result, beams of sputtered particles 70 and 80 shown in FIG. 5 are obtained from the erosion surface of the long side sections of the sputtering target 10. The beams of sputtered particles 70 and 80 have a nearly uniform intensity distribution in the longitudinal direction of the sputtering target 10.

Figure 6:
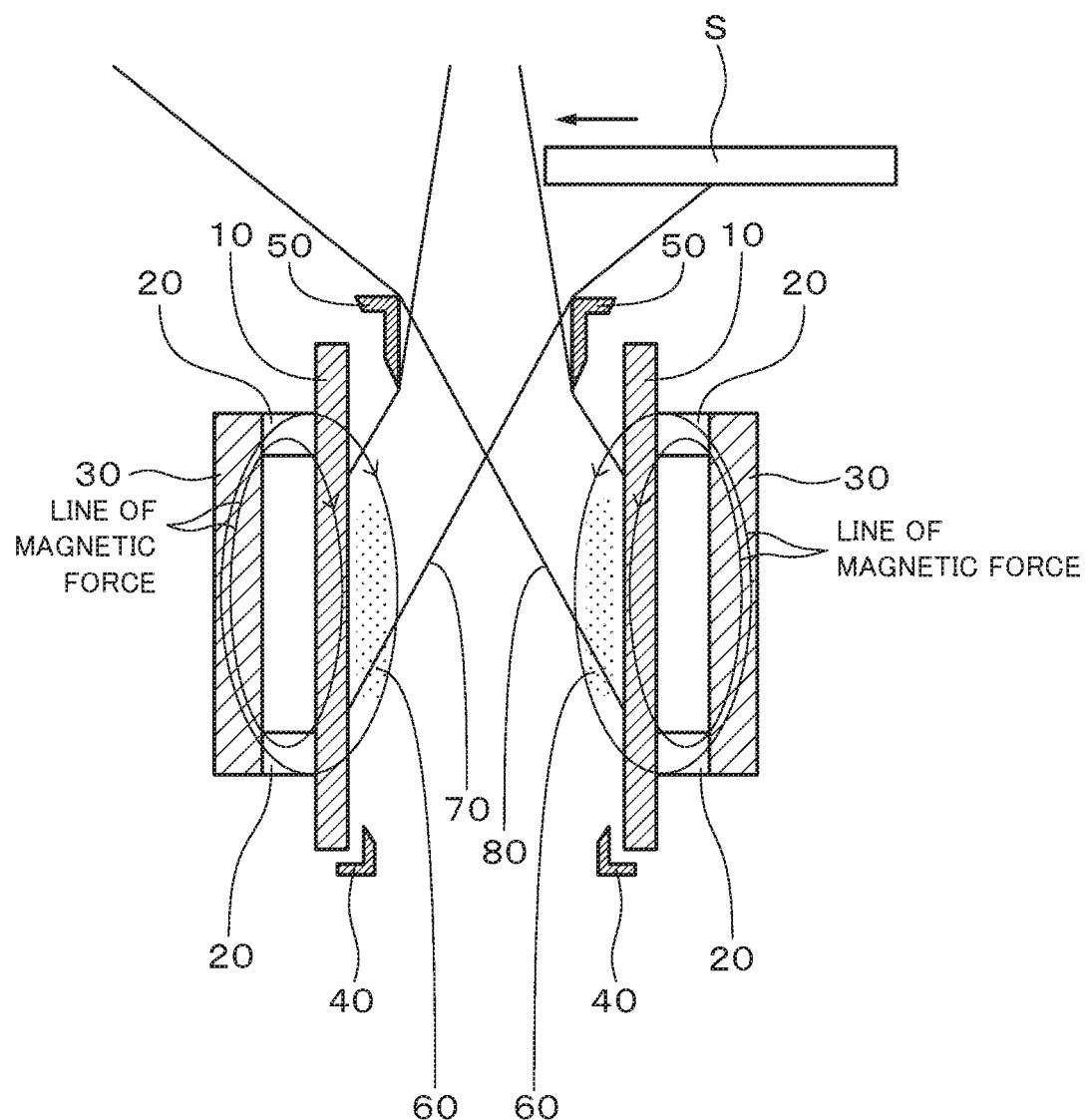
FIG. 6 A longitudinal cross-sectional view showing the method for forming a thin film on the substrate by the sputtering device according to the first embodiment of the invention.
Figure 7:
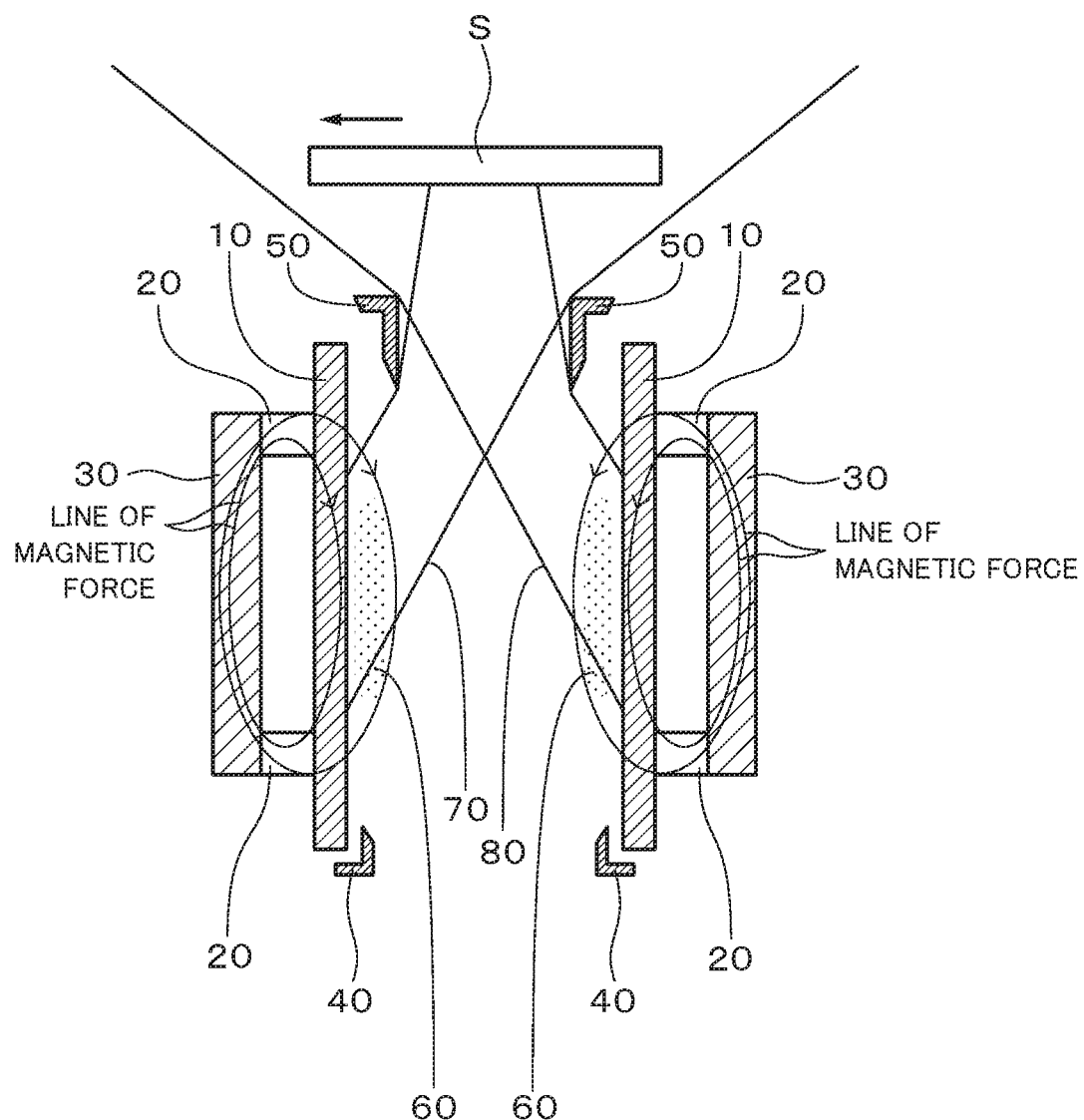
FIG. 7 A longitudinal cross-sectional view showing the method for forming a thin film on the substrate by the sputtering device according to the first embodiment of the invention.
Figure 8:
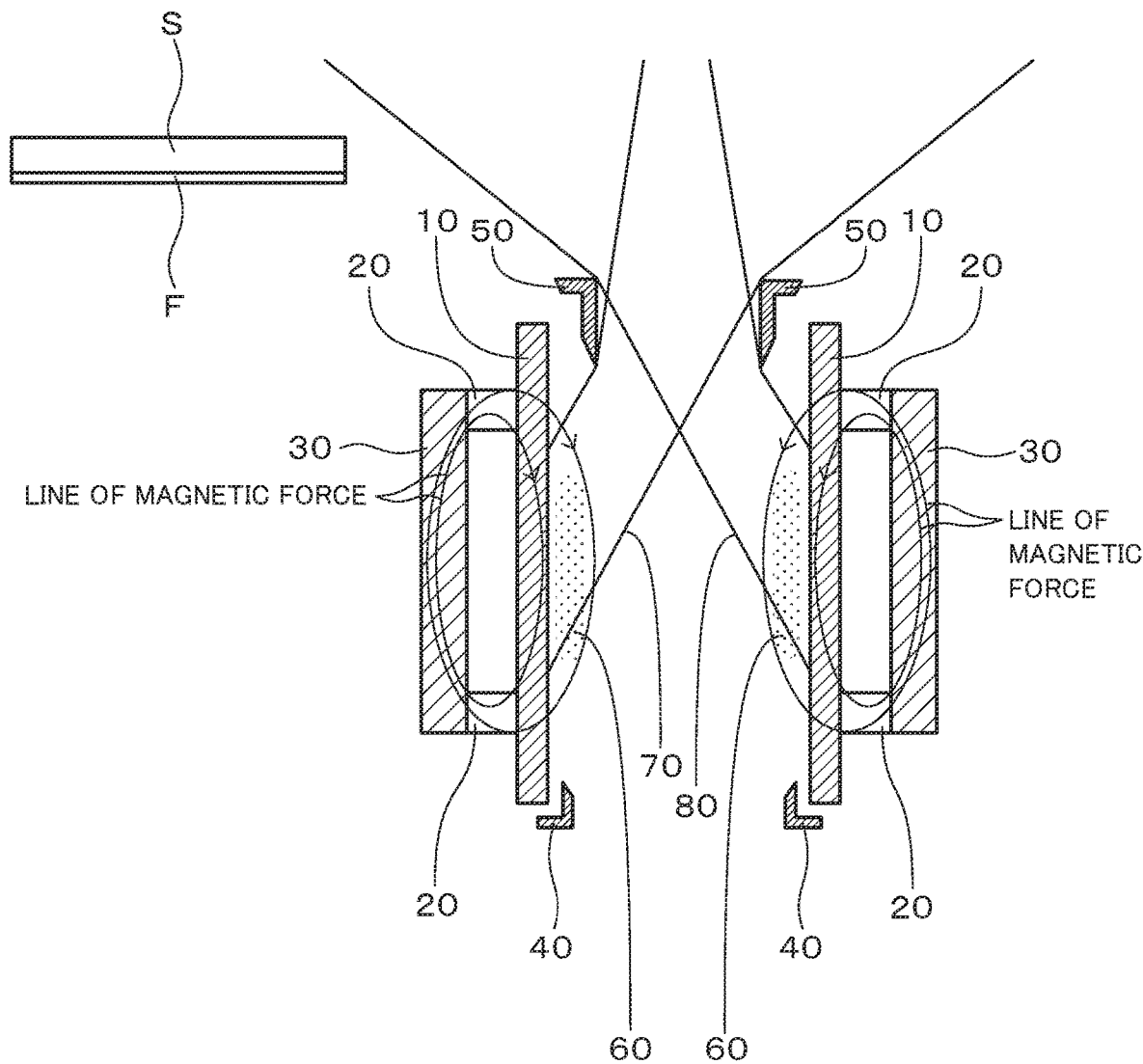
FIG. 8 A longitudinal cross-sectional view showing the method for forming a thin film on the substrate by the sputtering device according to the first embodiment of the invention.

When the stable beams of sputtered particles 70 and 80 are obtained, film formation is performed by the beams of sputtered particles 70 and 80 while the substrate S is moved for the sputtering target 10 at a constant speed in the direction traversing the long side sections of the sputtering target 10. When the substrate S is moved toward a position above the space surrounded by the sputtering target 10, the beam of sputtered particles 70 first irradiates the substrate S to begin film formation. FIG. 6 shows a state when the front of the substrate S just reaches a position above the center of the space surrounded by the sputtering target 10. At this time, the beam of sputtered particles 80 does not contribute to film formation. When the substrate S is moved further and the beam of sputtered particles 80 begins to irradiate the substrate S, the beam of sputtered particles 80 begins to contriubute film formation in addition to the beam of sputtered particles 70. FIG. 7 shows a state when the substrate S is moved to a position just above the space surrounded by the sputtering target 10. As shown in FIG. 7, the beams of sputtered particles 70 and 80 irradiate the substrate S to perform film formation. The substrate S is moved further while film formation is performed in this way. And as shown in FIG. 8, the substrate S is moved to a place far from the position above the space surrounded by the sputtering target 10 where the beams of sputtered particles 70 and 80 do not irradiate the substrate S. In this way, a thin film F is formed on the substrate S.

[Example of the Sputtering Cathode and the Anode of the Sputtering Device]

Figure 9:
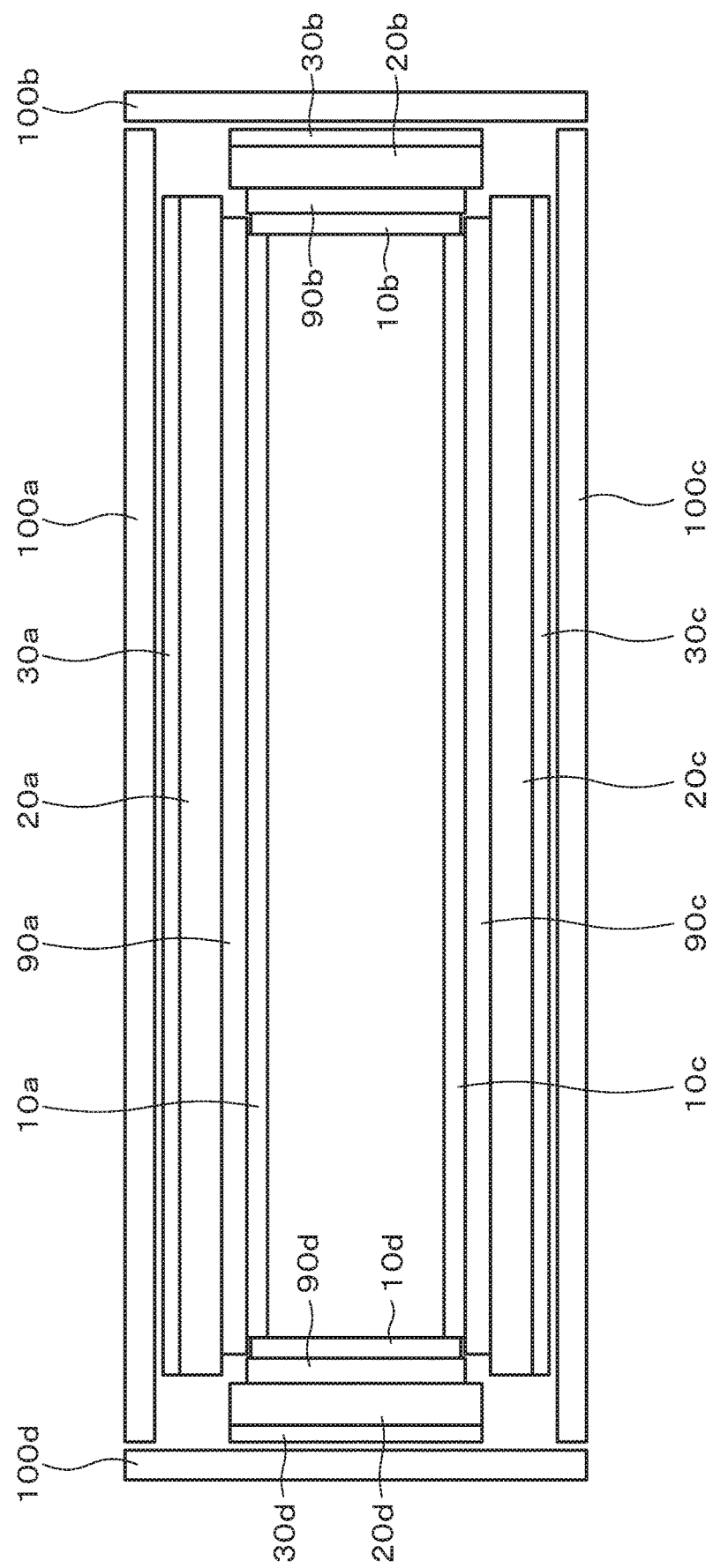
FIG. 9 A plan view showing the structure of the sputtering cathode and the anode as an example of the sputtering device according to the first embodiment of the invention.

As shown in FIG. 9, the sputtering target 10 is formed by four boardlike sputtering targets 10a, 10b, 10c and 10d, the permanent magnet 20 is formed by four boardlike or rodlike permanent magnets 20a, 20b, 20c and 20d and the yoke 30 is formed by four boardlike yokes 30a, 30b, 30c and 30d. Backing plates 90a, 90b, 90c and 90d are inserted between the sputtering targets 10a, 10b, 10c and 10d and the permanent magnets 20a, 20b, 20c and 20d, respectively. The distance between the sputtering target 10a and the sputtering target 10c is set to 80 mm, the distance between the sputtering target 10b and the sputtering target 10d is set to 200 mm and the heights of the sputtering targets 10a, 10b, 10c and 10d are set to 80 mm.

Four boardlike anodes 100a, 100b, 100c and 100d are formed outside the yokes 30a, 30b, 30c and 30d. The anodes 100a, 100b, 100c and 100d are connected to the vacuum chamber put to earth together with the anode 40.

As described above, according to the first embodiment, since the sputtering cathode has the sputtering target 10 having a rectangular tubular shape in which the cross-sectional shape thereof is a rectangular, and the erosion surface thereof faces inward, various advantages can be obtained as follows. That is, it is possible to generate the plasma 60 circulating along the inner surface of the sputtering target 10 on the side of the erosion surface of the sputtering target 10. Therefore, it is possible to increase the density of the plasma 60 to increase the rate of film formation sufficiently. Furthermore, the place where plenty of the plasma 60 is generated is limited near the surface of the sputtering target 10. In addition to this, the light stopping shield 50 is disposed. With this, it is possible to lower the risk of causing damage to the substrate S by irradiation of light generated from the plasma 60 to a minimum. Lines of magnetic force generated by the magnetic circuit formed by the permanent magnet 20 and the yoke 30 are restricted to the sputtering cathode and not bound for the substrate S. Therefore, there is no risk of causing damage to the substrate S by the plasma 60 and an electron beam. Since film formation is performed by using the beams of sputtered particles 70 and 80 obtained from the long side sections facing each other of the sputtering target 10, it is possible to lower the risk of causing damage to the substrate S by bombardment of high energy particles of reflected sputtering neutral gases. Furthermore, the beams of sputtered particles 70 and 80 obtained from the long side sections facing each other of the sputtering target 10 have a uniform intensity distribution in the direction parallel to the long side sections. In addition to this, film formation is performed while the substrate S is moved at a constant speed in the direction traversing the long side sections, for example the direction perpendicular to the long side sections. Therefore, it is possible to reduce unevenness of the thickness of the thin film F formed on the substrate S. For example, thickness distribution of the thin film F can be controlled within ±5%. The sputtering device is preferably applied to film formation of electrode materials in various devices such as semiconductor devices, solar batteries, liquid crystal displays, organic EL displays.

The Second Embodiment

[Sputtering Device]

In the sputtering device, the sputtering target 10 comprises the sputtering targets 10a, 10b, 10c and 10d shown in FIG. 9. Here, the sputtering targets 10a and 10b forming the long side sections facing each other are made of materials different from each other. Other construction of the sputtering device is as the same as the sputtering device according to the first embodiment.

[Method for Forming a Film by the Sputtering Device>

As the same as the first embodiment, film formation is performed in the film formation region of the substrate S by using the beams of sputtered particles 70 and 80. In this case, since the sputtering targets 10a and 10b are made of materials different from each other, constituent atoms of the beam of sputtered particles 70 and constituent atoms of the beam of sputtered particles 80 are different from each other. Therefore, the thin film F formed on the substrate S has the composition in which constituent atoms of the beam of sputtered particles 70 and constituent atoms of the beam of sputtered particles 80 are mixed, in other words, almost the composition in which constitutent atoms of the material forming the sputtering target 10*a* and constituent atoms of the material forming the sputtering target 10*c* are mixed.

According to the second embodiment, it is possible to obtain further advantage that it is possible to form the thin film F having the composition in which the constituent atoms of the material forming the sputtering target 10*a* and the constituent atoms of the material forming the sputtering target 10*c* are mixed. Therefore, for example, by forming the sputtering target 10*a* by titanium having the function of improving adhesiveness of a thin film and by forming the sputtering target 10*c* by another metal, it is possible to form the thin film F having the composition in which titanium and another metal are mixed to obtain the thin film F having excellent cohesiveness for the substrate S.

The Third Embodiment

[Sputtering Device]

Figure 10:
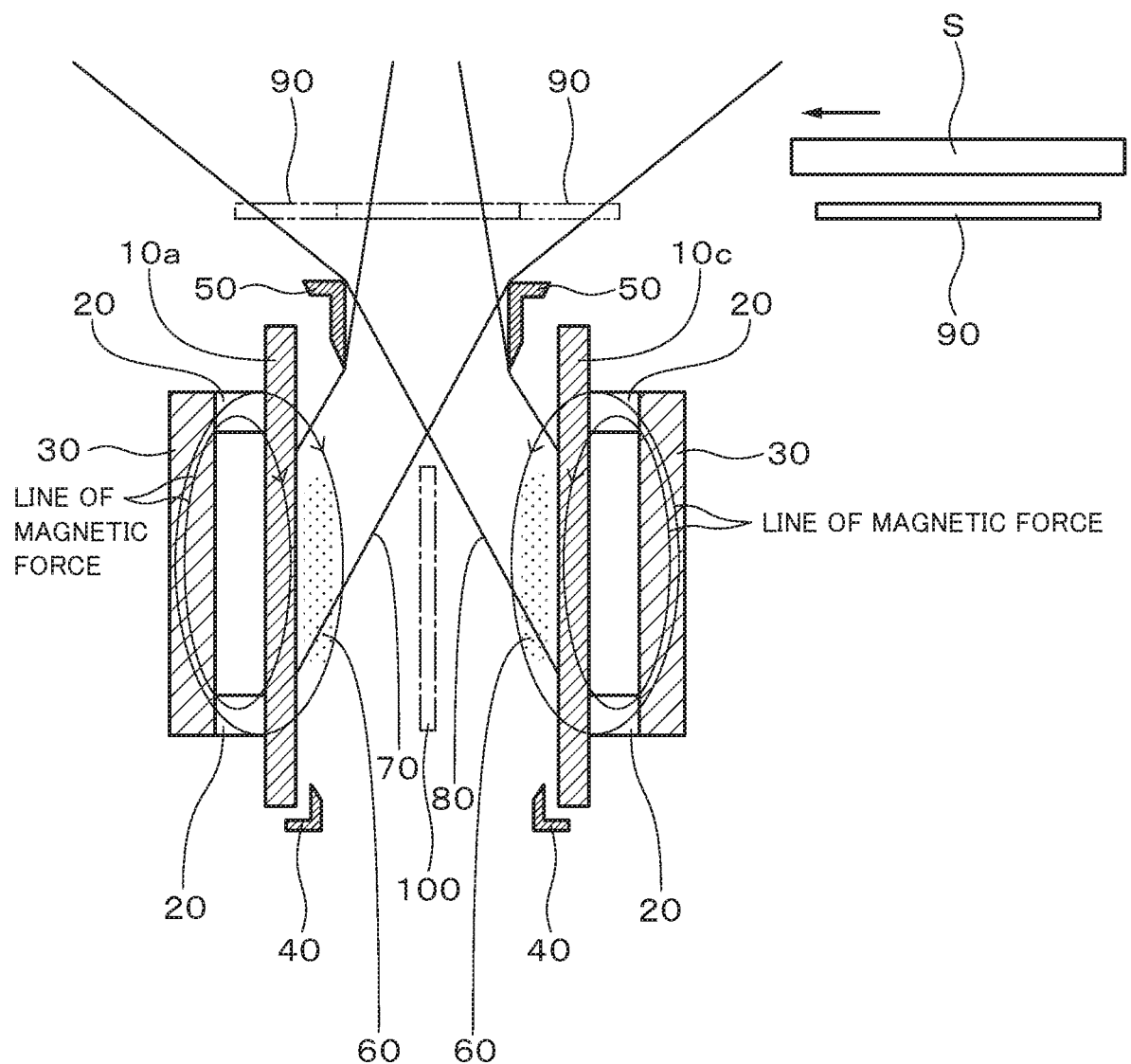
FIG. 10 A plan view showing a sputtering device according to a third embodiment of the invention.

FIG. 10 shows the sputtering device according to the third embodiment. In the sputtering device, as the same as the sputtering device according to the second embodiment, the sputtering target 10 comprises the sputtering targets 10*a*, 10*b*, 10*c* and 10*d* shown in FIG. 9, the sputtering targets 10*a* and 10*c* of the long side sections facing each other being made of materials different from each other. In addition, as shown in FIG. 10, in the sputtering device, a horizontal shield plate 90 held by a carrying mechanism not illustrated can be placed at a height between the height of the substrate S and the height of the light stopping shield 50 so as to stop the beam of sputtered particles 80 from the sputtering target 10*c* or the beam of sputtered particles 70 from the sputtering target 10*a*. Other construction of the sputtering device is as the same as the sputtering device according to the first embodiment.

[Method for Forming a Film by the Sputtering Device]

Figure 11:
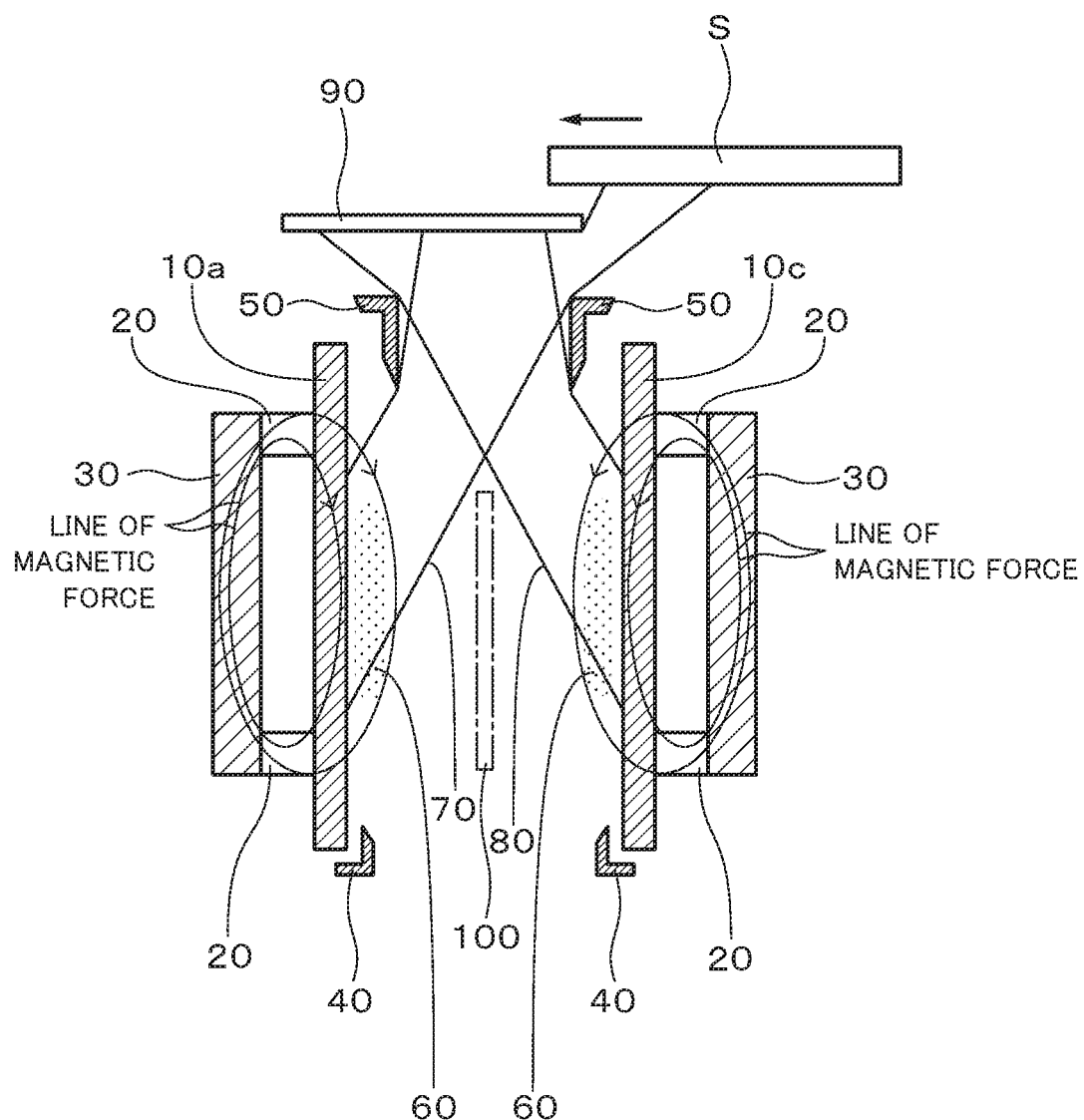
FIG. 11 A longitudinal cross-sectional view showing a method for forming a thin film on a substrate by the sputtering device according to the third embodiment of the invention.
Figure 12:
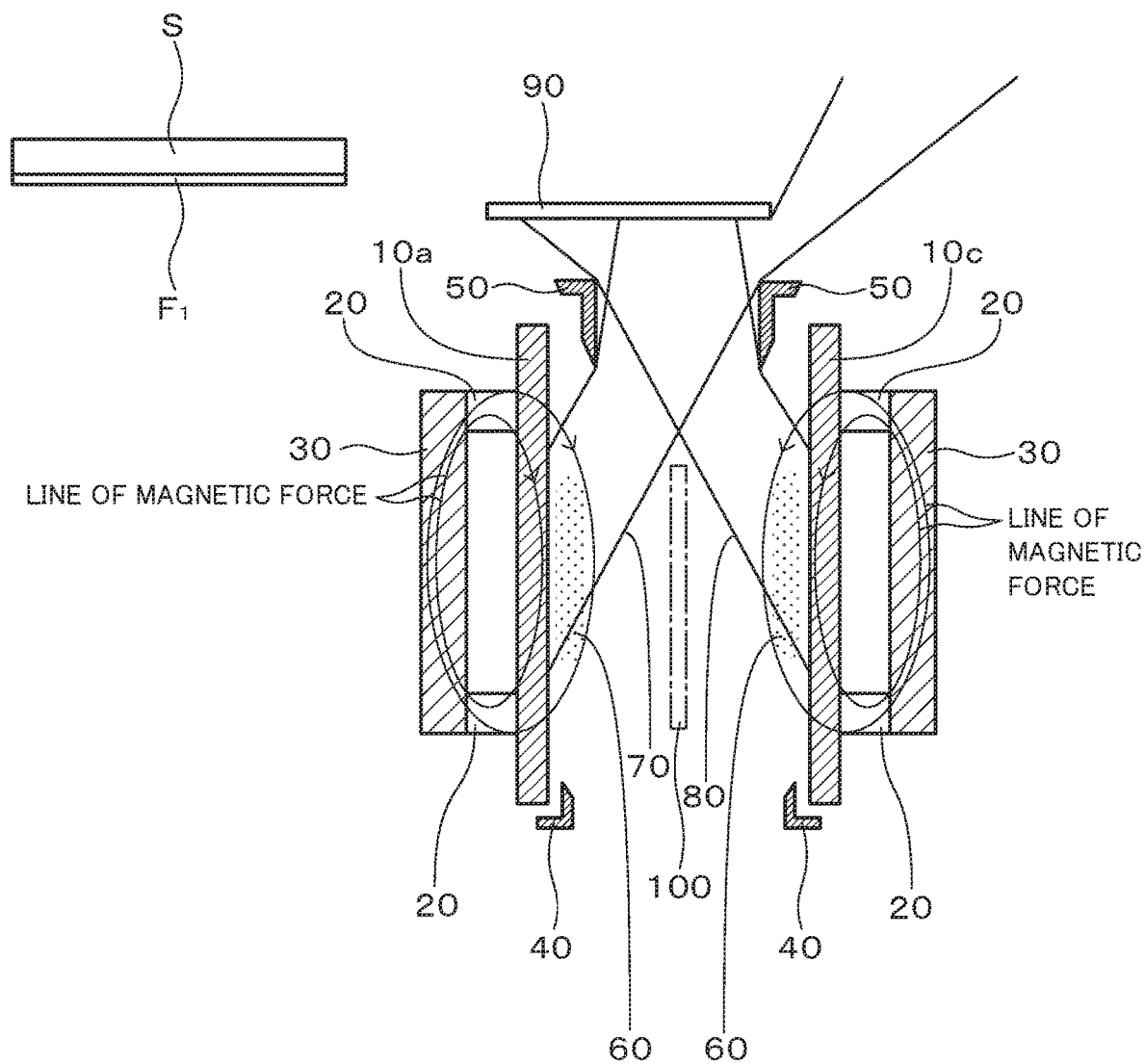
FIG. 12 A longitudinal cross-sectional view showing the method for forming a thin film on the substrate by the sputtering device according to the third embodiment of the invention.
Figure 13:
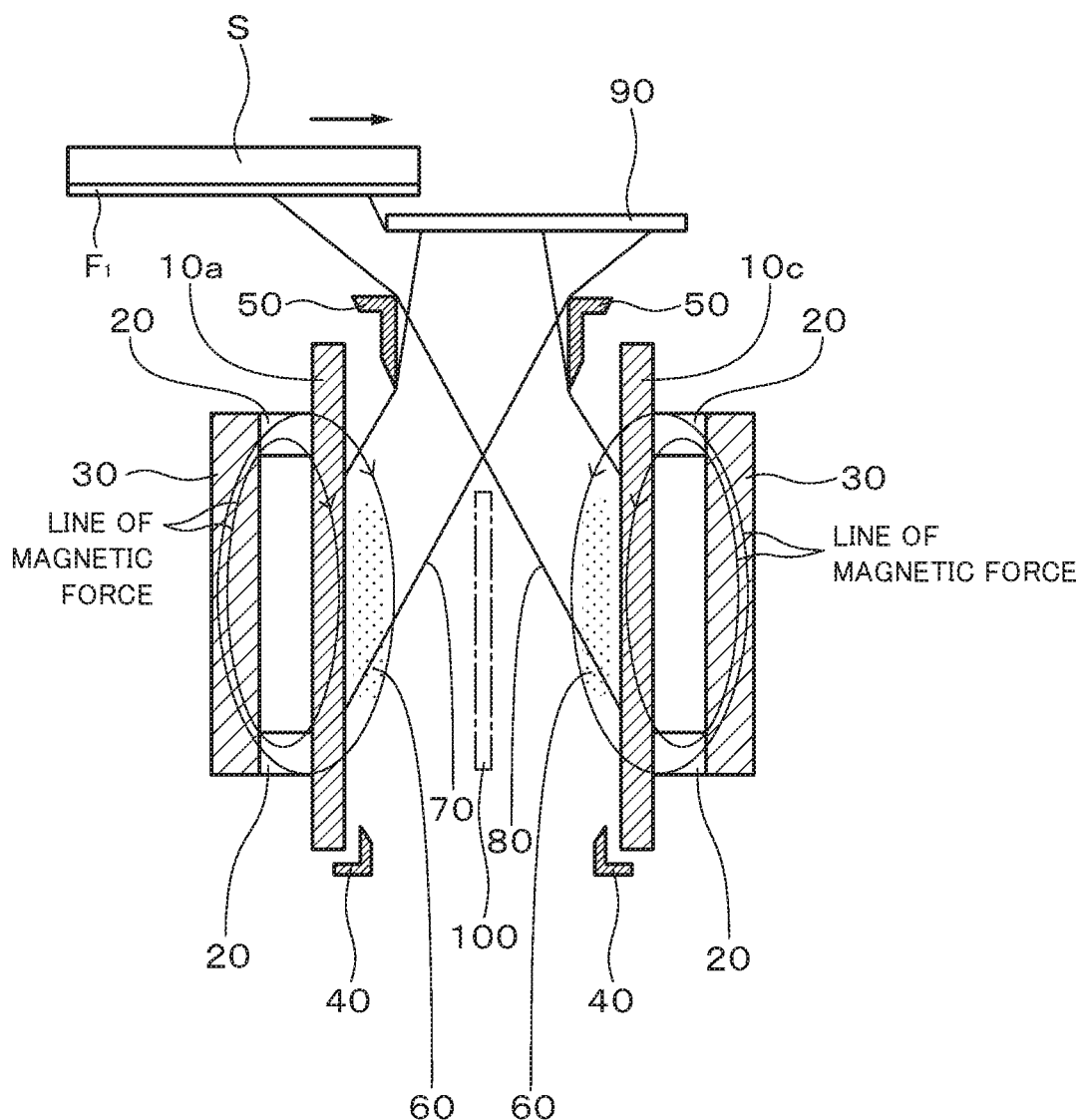
FIG. 13 A longitudinal cross-sectional view showing the method for forming a thin film on the substrate by the sputtering device according to the third embodiment of the invention.
Figure 14:
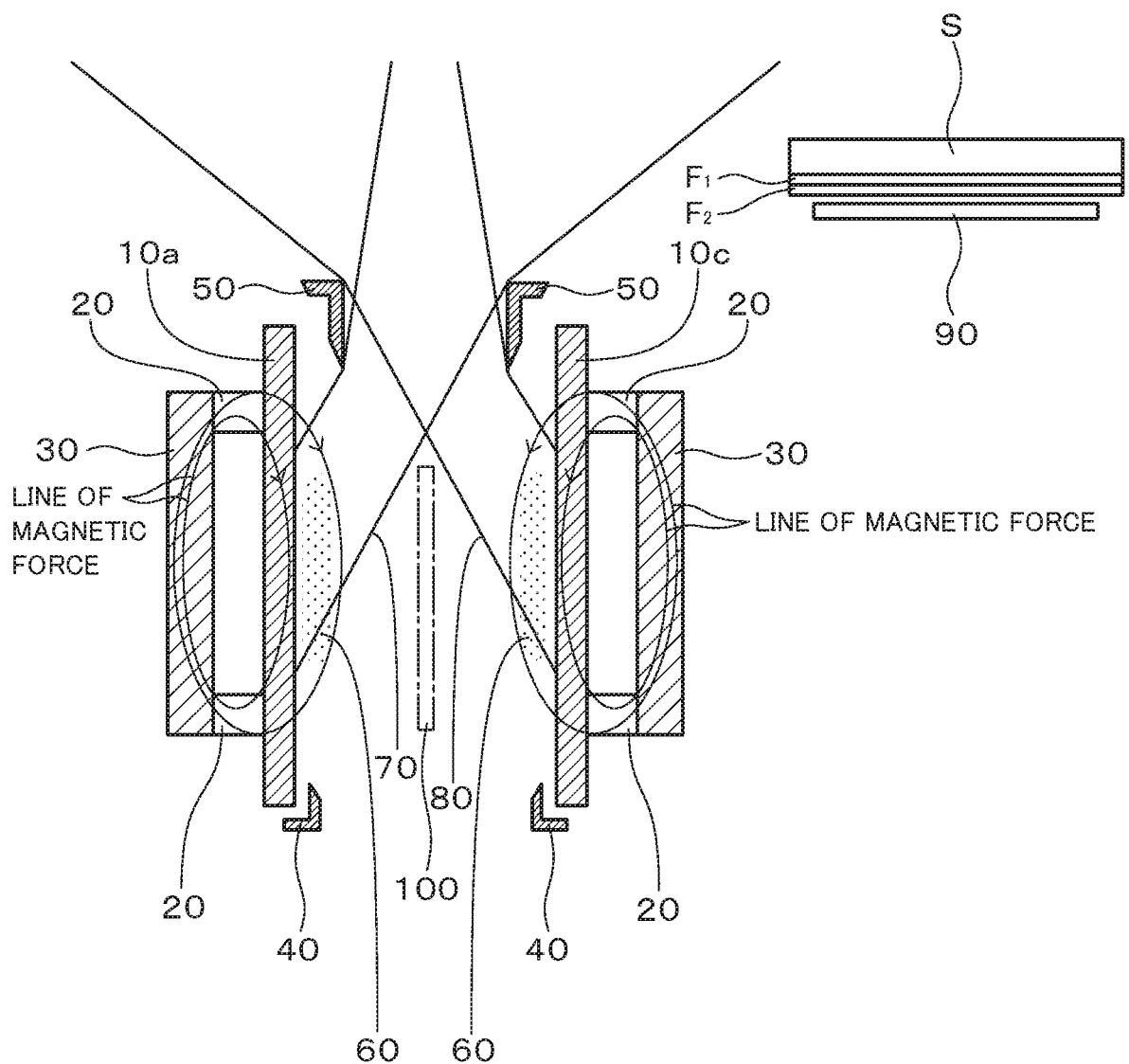
FIG. 14 A longitudinal cross-sectional view showing the method for forming a thin film on the substrate by the sputtering device according to the third embodiment of the invention.

For example, in order to form a thin film on the substrate S by only the beam of sputtered particles 70, the horizontal shield plate 90 is first moved to a position shown by an alternate long and short dashes line in FIG. 10. At this moment, the beam of sputtered particles 80 is stopped by the horizontal shield plate 90. In this state, film formation is performed in the film formation region of the substrate S by using only the beam of sputtered particles 70 as shown in FIG. 11 while the substrate S is moved in the direction shown by an arrow in FIG. 10. As shown in FIG. 12, the sutstrate S is moved to a position far from the position above the space surrounded by the sputtering targets 10*a*, 10*b*, 10*c* and 10*d*. In this way, a thin film $F_1$ is formed. The thin film $F_1$ is composed of constituent atoms of the beam of sputtered particles 70, almost constituent atoms of the material forming the sputtering target 10*a*. Next, the horizontal shield plate 90 is moved to a position shown by an alternate long and two short dashes line where the beam of sputtered particles 70 is stopped as shown in FIG. 10. In this state, as shown in FIG. 13, film formation is performed in the film formation region of the substrate S by using only the beam of sputtered particles 80 while the substrate S is moved in the direction opposite to the direction shown by the arrow in FIG. 10. As shown in FIG. 14, the substrate S is moved to a position far from the position above the space surrounded by the sputtering targets 10*a*, 10*b*, 10*c* and 10*d*. In this way, a thin film $F_2$ is formed on the thin film $F_1$. The thin film $F_2$ is composed of constituent atoms of the beam of sputtered particles 80, almost constituent atoms of the material forming the sputtering target 10*c*. Thus, it is possible to form the two-layer film made of the thin film $F_1$ and the thin film $F_2$ having compositions different from each other.

In order to prevent constituent atoms of the thin film $F_1$ from containing constituent atoms of the material forming the sputtering target 10*c* and on the contrary in order to prevent constituent atoms of the thin film $F_2$ from containing constituent atoms of the material forming the sputtering target 10*a*, for example, as shown in FIG. 10, a vertical shield plate 100 may be inserted into the central part of the space between the sputtering target 10*a* and the sputtering target 10*c* to prevent constituent atoms of the material forming the sputtering target 10*c* from mixing with the beam of sputtered particles 70 and to prevent constituent atoms of the material forming the sputtering target 10*a* from mixing with the beam of sputtered particles 80. One of the characteristics of the sputtering cathode is that the vertical shield plate 100 can be inserted in this way. That is, in the sputtering cathode, the plasma 60 circulates near the surface of the four boardlike sputtering targets 10*a*, 10*b*, 10*c* and 10*d* and the plasma 60 is not generated in the central part of the space between the sputtering target 10*a* and the sputtering target 10*c*. A shield plate inclined to the vertical direction may be used instead of the vertical shield plate 100.

According to the third embodiment, in addition to the same advantages as the first embodiment, it is possible to obtain further advantage that it is possible to form the two-layer film made of the thin film $F_1$ and the thin film $F_2$ having compositions different from each other. Therefore, for example, by forming the sputtering target 10*a* from titanium having the function of improving adhesiveness of a thin film and forming the sputtering target 10*c* from another metal, it is possible to form first the thin film $F_1$ composed of titanium having excellent adhesiveness for the substrate S and then form the thin film $F_2$ composed of another metal thereon to obtain the two-layer film made of the thin film $F_1$ having excellent adhesiveness for the substrate S and the thin film $F_2$.

The Fourth Embodiment

[Sputtering Device]

Figure 15:
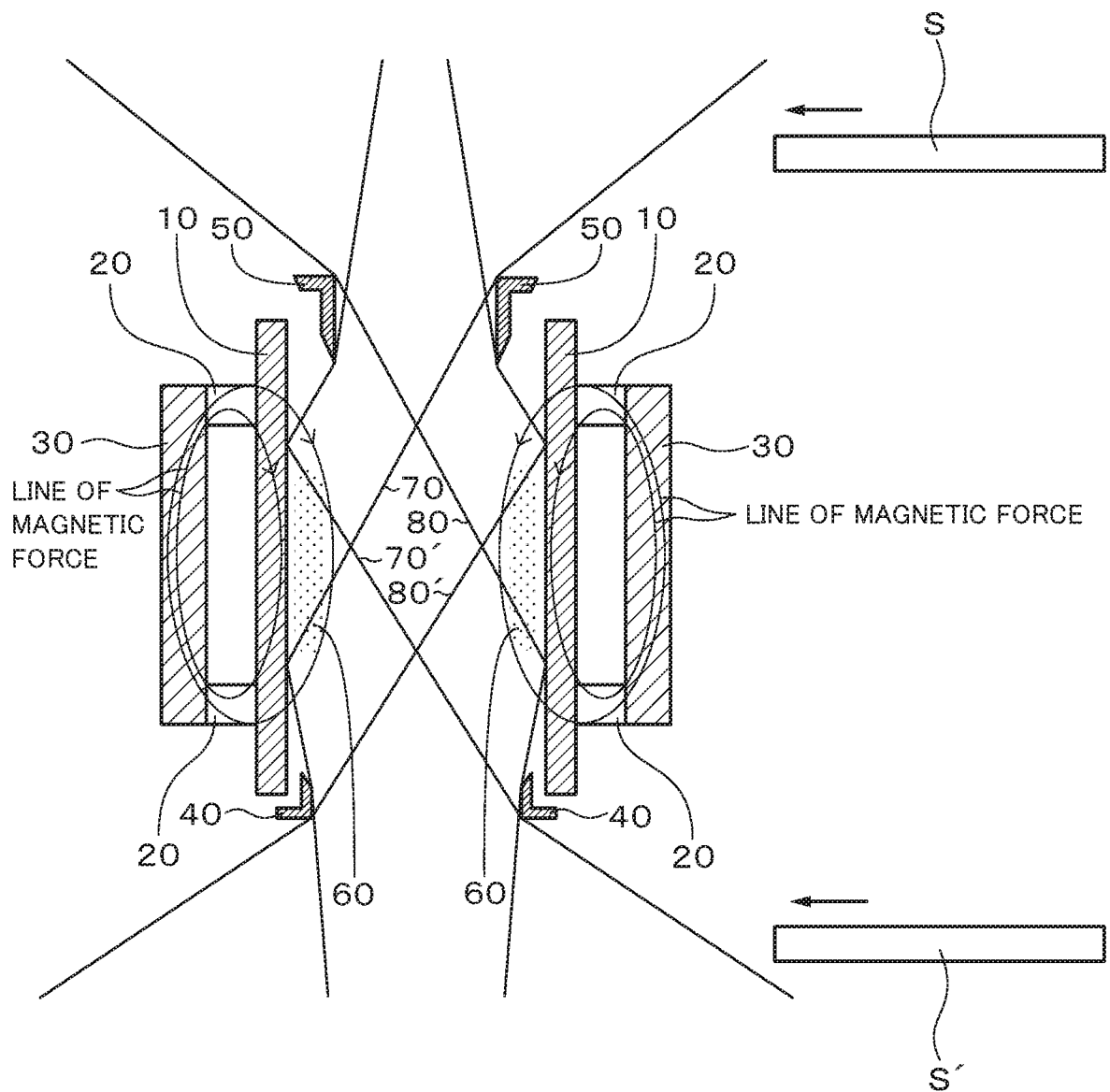
FIG. 15 A longitudinal cross-sectional view showing a sputtering device according to a fourth embodiment of the invention.

The sputtering device according to the fourth embodiment has basically the same structure as the sputtering device according to the first embodiment. In the first embodiment, film formation is performed by using the beams of sputtered particles 70 and 80 taken out over the space surrounded by the sputtering target 10 while the substrate S is moved. In the fourth embodiment, in addition to this, as shown in FIG. 15, film formation is performed on another substrate by using beams of sputtered particles 70' and 80' taken out below the space surrounded by the sputtering target 10 from the long side sections facing each other of the sputtering target 10. Here, in the sputtering device, for example, by fixing the sputtering cathode and the anode 40 to the inner surface of the sidewall of the vacuum chamber, it is possible to secure space for film formation below the space surrounded by the sputtering target 10.

[Method for Forming a Film by the Sputtering Device]

As shown in FIG. 15, the beams of sputtered particles 70 and 80 are taken above the space surrounded by the sputtering target 10 and at the same time the beams of sputtered particles 70' and 80' are taken below the space surrounded by the sputtering target 10. Film formation is performed on the substrate S by using the beams of sputtered particles 70 and 80 above the space surrounded by the sputtering target 10 while the substrate S is moved for the sputtering target 10 in the direction traversing the long side sections of the sputtering target 10. At the same time, film formation is performed on the substrate S' by using the beams of sputtered particles 70' abd 80' below the space surrounded by the sputtering target 10 while the substrate S' is moved for the sputtering target 10 in the direction traversing the long side sections of the sputtering target 10. That is, it is possible to perform film formation on the substrate S above the space surrounded by the sputtering target 10 and perform at the same time film formation on the substrate S' below the space surrounded by the sputtering target 10.

According to the fourth embodiment, in addition to the same advantages as the first embodiment, it is possible to obtain further advantage that it is possible to increase productivity markedly because film formation can be performed on the two substrates S and S' at the same time.

The Fifth Embodiment

[Sputtering Device]

Figure 16:
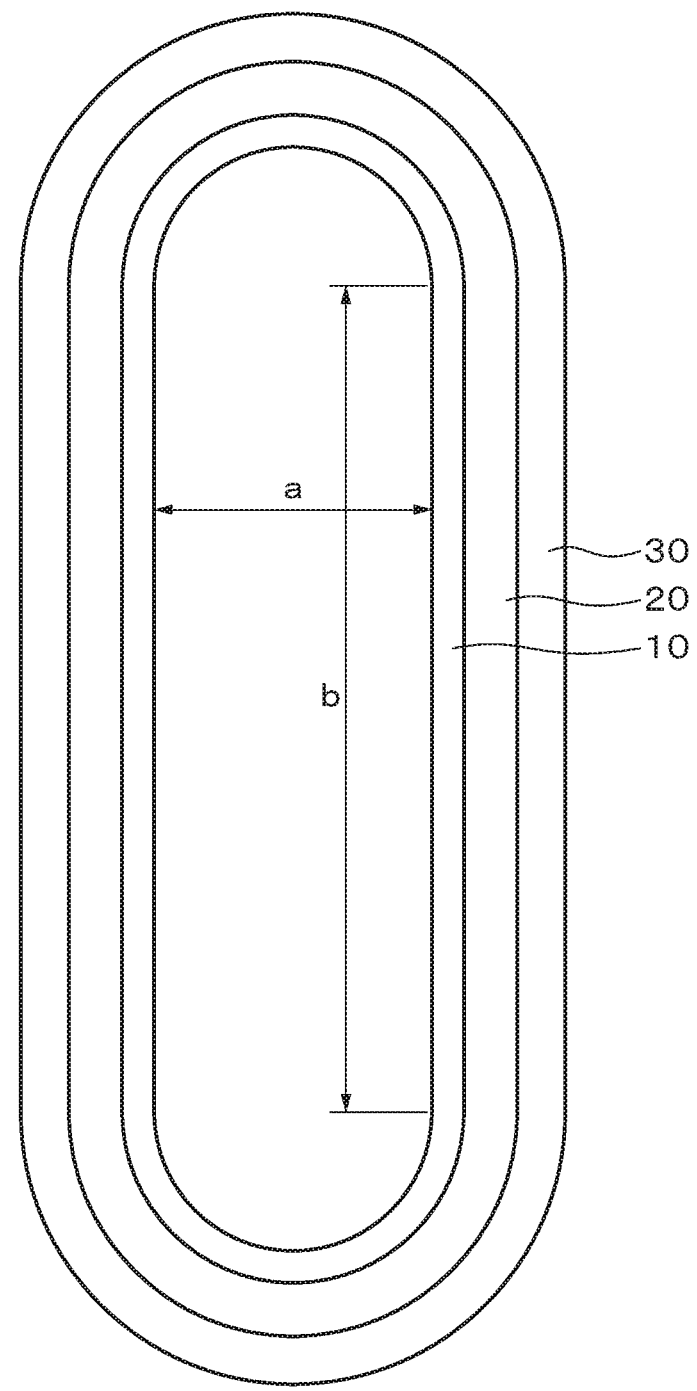
FIG. 16 A plan view showing a sputtering cathode of a sputtering device according to a fifth embodiment of the invention.

The sputtering device according to the fifth embodiment differs from the sputtering device according to the first embodiment in that the sputtering target 10 shown in FIG. 16 is used. That is, as shown in FIG. 16, the sputtering target 10 comprises a pair of long side sections facing parallel each other and semicircular sections connected to the long side sections. The permanent magnet 20 disposed outside the sputtering target 10 and the yoke 30 disposed outside the permanent magnet 20 have the same shape as the sputtering target 10. Other construction of the sputtering device is the same as the sputtering device according to the first embodiment.

[Method for Forming a Film by the Sputtering Device]

The method for forming a film by the sputtering device is the same as the first embodiment.

According to the fifth embodiment, it is possible to obtain the same advantages as the first embodiment.

The Sixth Embodiment

[Sputtering Device]

Figure 17A:
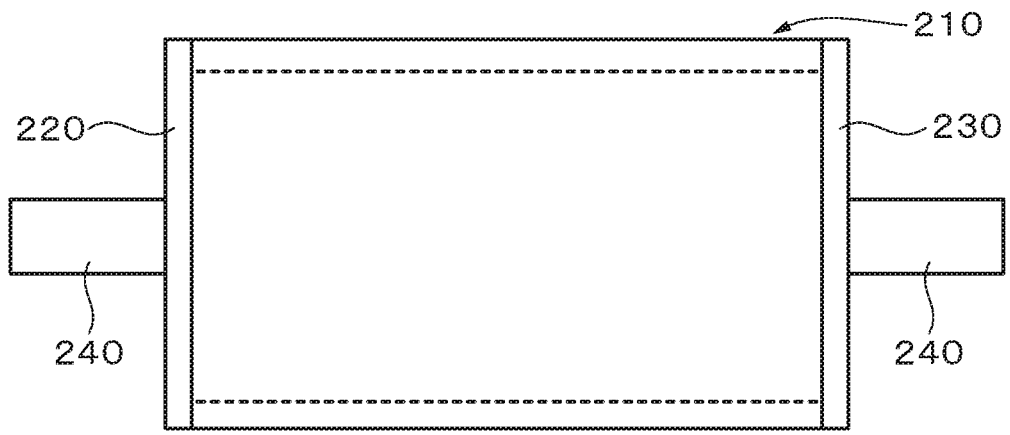
FIG. 17A A front view showing a film formation roller used in a sputtering device according to a sixth embodiment of the invention.
Figure 17B:
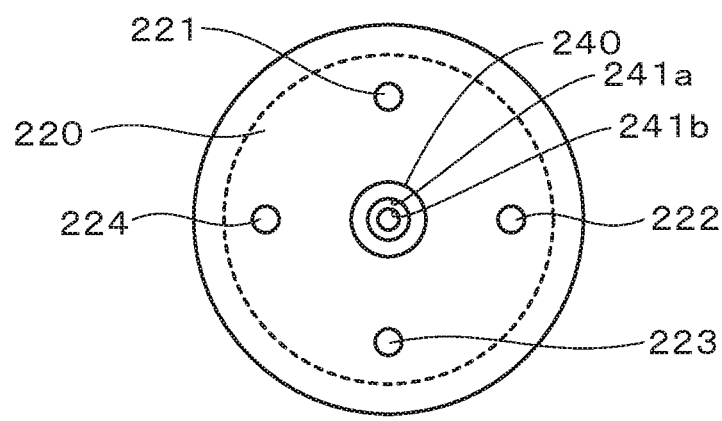
FIG. 17B A left side view showing the film formation roller used in the sputtering device according to the sixth embodiment of the invention.
Figure 17C:
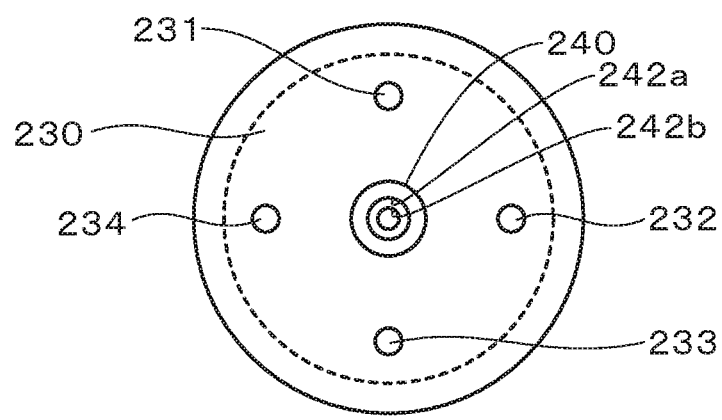
FIG. 17C A right side view showing the film formation roller used in the sputtering device according to the sixth embodiment of the invention.
Figure 17D:
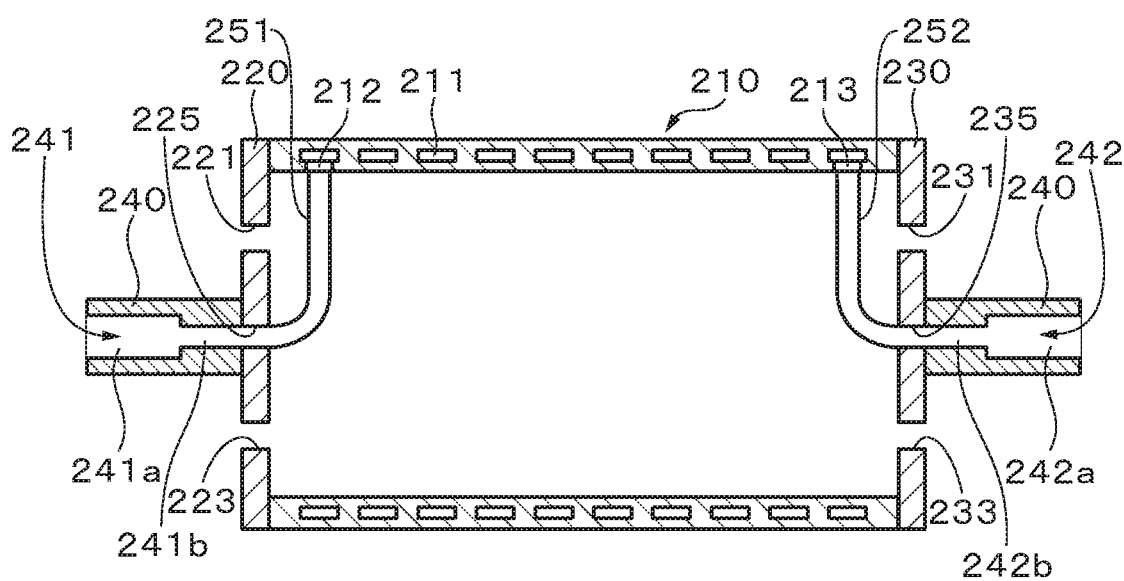
FIG. 17D A longitudinal cross-sectional view showing the film formation roller used in the sputtering device according to the sixth embodiment of the invention.

The sputtering device according to the sixth embodiment is a sputtering device in which film formation is performed by a roll-to-roll method and differs from the sputtering device according to the first embodiment in that the film formation roller shown in FIG. 17A, FIG. 17B, FIG. 17C and FIG. 17D is used as the film formation roller around which a body to be film-formed is wound. Here, FIG. 17A is a front view, FIG. 17B is a left side view, FIG. 17C is a right side view and FIG. 17D is a longitudinal cross-sectional view.

As shown in FIG. 17A, FIG. 17B, FIG. 17C and FIG. 17D, the film formation roller comprises a cylindrical section 210, circular boards 220 and 230 attached to both ends of the cylindrical section 210 such as to close the cylindrical section 210, and a shaft 240 disposed on the central axis of the film formation roller, therefore the cylindrical section 210 outside the circular boards 220 and 230.

Figure 18A:
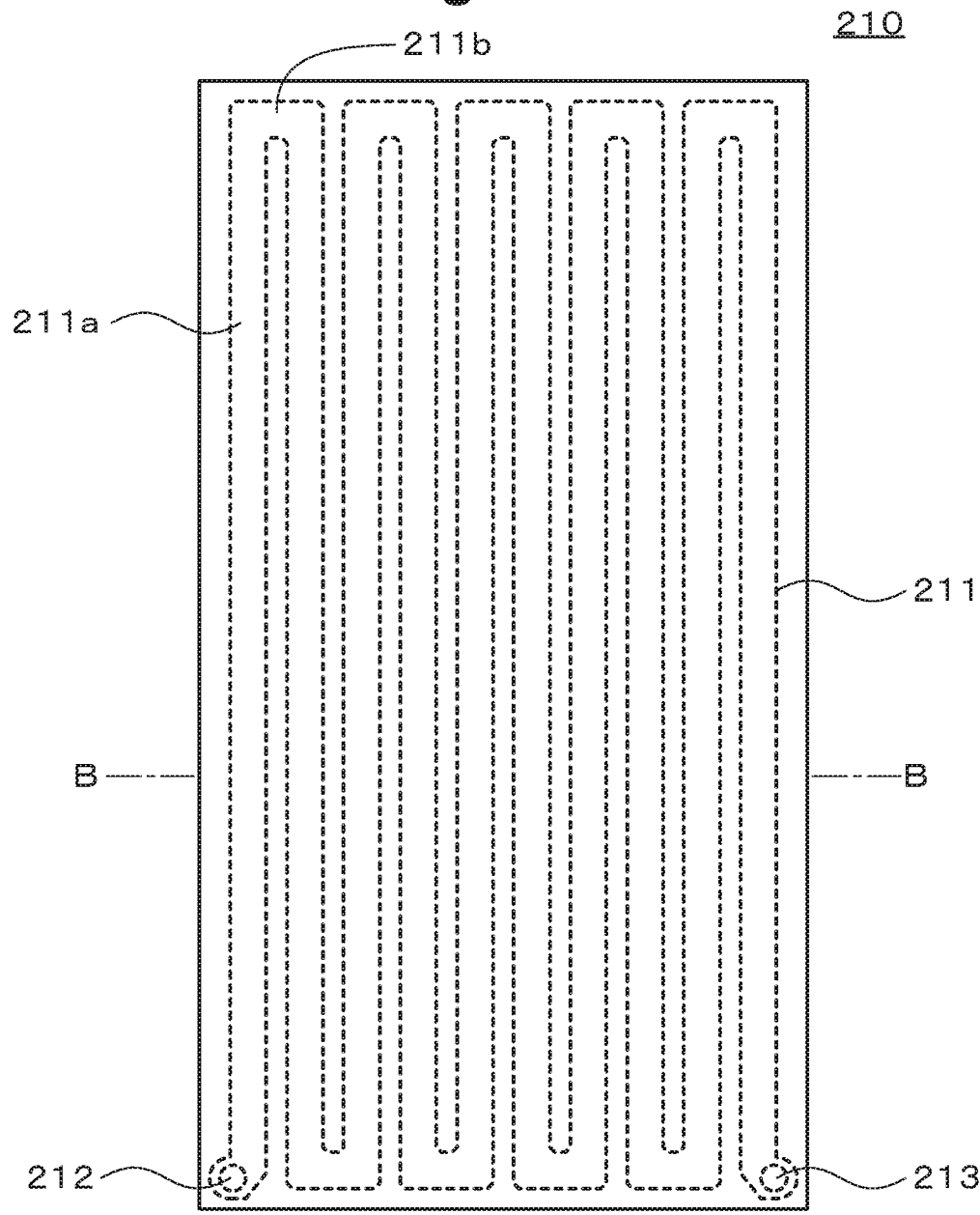
FIG. 18A A plan view showing a state where a cylindrical section of the film formation roller used in the sputtering device according to the sixth embodiment of the invention is expanded in a plane.
Figure 18B:
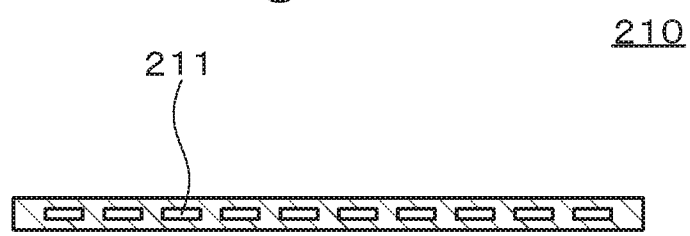
FIG. 18B A cross-sectional view along the B-B line of FIG. 18A.

The cylindrical section 210 has a built-in flow passage 211 having the rectangular cross-sectional shape parallel to the central axis of the cylindrical section 210. That is, the flow passage 211 is buried in the cylindrical section 210. FIG. 18A is a plan view in a state in which the cylindrical section 210 is expanded in a plane and FIG. 18B is a cross-sectional view along the B-B line of FIG. 18A. As shown in FIG. 18A and FIG. 18B, in the example, the shape when the cylindrical section 210 is expanded in a plane is a rectangular and the flow passage 211 has a linear section 211a elongating parallel to long sides of the rectangle and a turn back section 211b folded vertical to the linear section 211a, which are provided alternately, and has a zigzag folded shape. A hole 212 serving as an inlet of fluid such as cooling water is formed on one end of the flow passage 211 and a hole 213 serving as an outlet of fluid is formed on the other end thereof. The cylindrical section 210 is made of copper, copper alloy, aluminum or aluminum alloy, preferably made of oxygen free copper having the highest thermal conductivity among these materials. Thermal conductivity of oxygen free copper is about twenty three times higher than that of stainless steel (SUS304), for example. Although not illustrated, hard chromium plating is formed on at least the outer peripheral surface, typically the outer peripheral surface and the inner peripheral surface of the cylindrical section 210. If the hard chromium plating layer is too thick, thermal conductivity of the cylindrical section 210 decreases. If the hard chromium plating layer is too thin, effect of surface hardening of the cylindrical section 210 is little. Therefore, the thickness of the hard chromium plating layer is generally selected to be not less than 20 μm and not larger than 40 μm, for example 30 μm. Hardness of the hard chromium plating layer may be, for example, not less than 500 in Vickers hardness. If necessary, the surface of the hard chromium plating layer is flattened by polishing to decrease surface roughness $R_a$ drastically, for example, to about 10 nm.

The circular boards 220 and 230 are fixed to both ends of the cylindrical section 210 by bolting, welding, etc. Four circular throughholes 221 to 224 are formed in the circular board 220 every 90° around the central axis. Similarly, four circular throughholes 231 to 234 are formed in the circular board 230 every 90° around the central axis at positions corresponding to the throughholes 221 to 224 of the circular board 220. The throughholes 221 to 224 and 231 to 234 are formed so that when the film formation roller is installed in the vacuum chamber of the sputtering device and the vacuum chamber is evacuated, pressure difference between the inside and the outside of the cylindrical section 210 is eliminated to prevent external force resulting from the pressure difference from applying to the cylindrical section 210 and the circular boards 220 and 230. Diameters of the throughholes 221 to 224 and 231 to 234 are appropriately selected so as to obtain mechanical strength of the circular boards 220 and 230. The circular boards 220 and 230 are made of, for example, stainless steel.

A throughhole 241 having the circular cross-sectional shape is formed on the central axis of the shaft 240 fixed to the circular board 220. The throughhole 241 comprises a section 241a having the diameter $d_1$ extending from the front end of the shaft 240 to an intermediate depth position and a section 241b having the diameter $d_2$ smaller than $d_1$ extending from the intermediate depth position to the circular board 220. A throughhole 225 communicating with the section 241b is formed in the circular board 220 on the central axis of the shaft 240. One end of a pipe 251 is hermetically fixed such as to communicate with the throughhole 225. The other end of the pipe 251 is connected with the hole 212 formed on the end of the flow passage 211 on the side of the circular board 220. Similarly, a throughhole 242 having the circular cross-sectional shape is formed on the central axis of the shaft 240 fixed to the circular board 230. The throughhole 242 comprises a section 242a having the diameter $d_1$ extending from the front end of the shaft 240 to an intermediate depth position and a section 242b having the diatemer $d_2$ smaller than $d_1$ extending from the intermediate depth position to the circular board 230. A throughhole 235 communicating with the section 242b is formed in the circular board 230 on the central axis of the shaft 240. One end of a pipe 252 is hermetically fixed such as to communicate with the throughhole 235. The other end of the pipe 252 is connected with the hole 213 formed on the end of the flow passage 211 on the side of the circular board 230. A flexible metal pipe, for example, a bellows pipe is preferably used as the pipes 250 and 251. Fluid is supplied from, for example, the throughhole 241 of the shaft 240 fixed to the circular board 220 by a fluid circulation mechanism not illustrated, poured into the flow passage 211 from the hole 212 of the cylindrical section 210 through the pipe 251, ejected from the hole 231 through the flow passage 211, ejected from the throughhole 242 of the shaft 240 fixed to the circular board 230 through the pipe 252 and circulated in the path.

Size of each section of the film formation roller is appropriately selected. Sizes are exemplified as the total length of 500 mm, diameter of 400 mm, thickness of the cylindrical section 210 of 10 mm, cross section of the flow passage 211 of 35 mm×5 mm and interval of the flow passage 211 of 15 mm.

The film formation roller can be made as follows, for example.

Figure 19A:
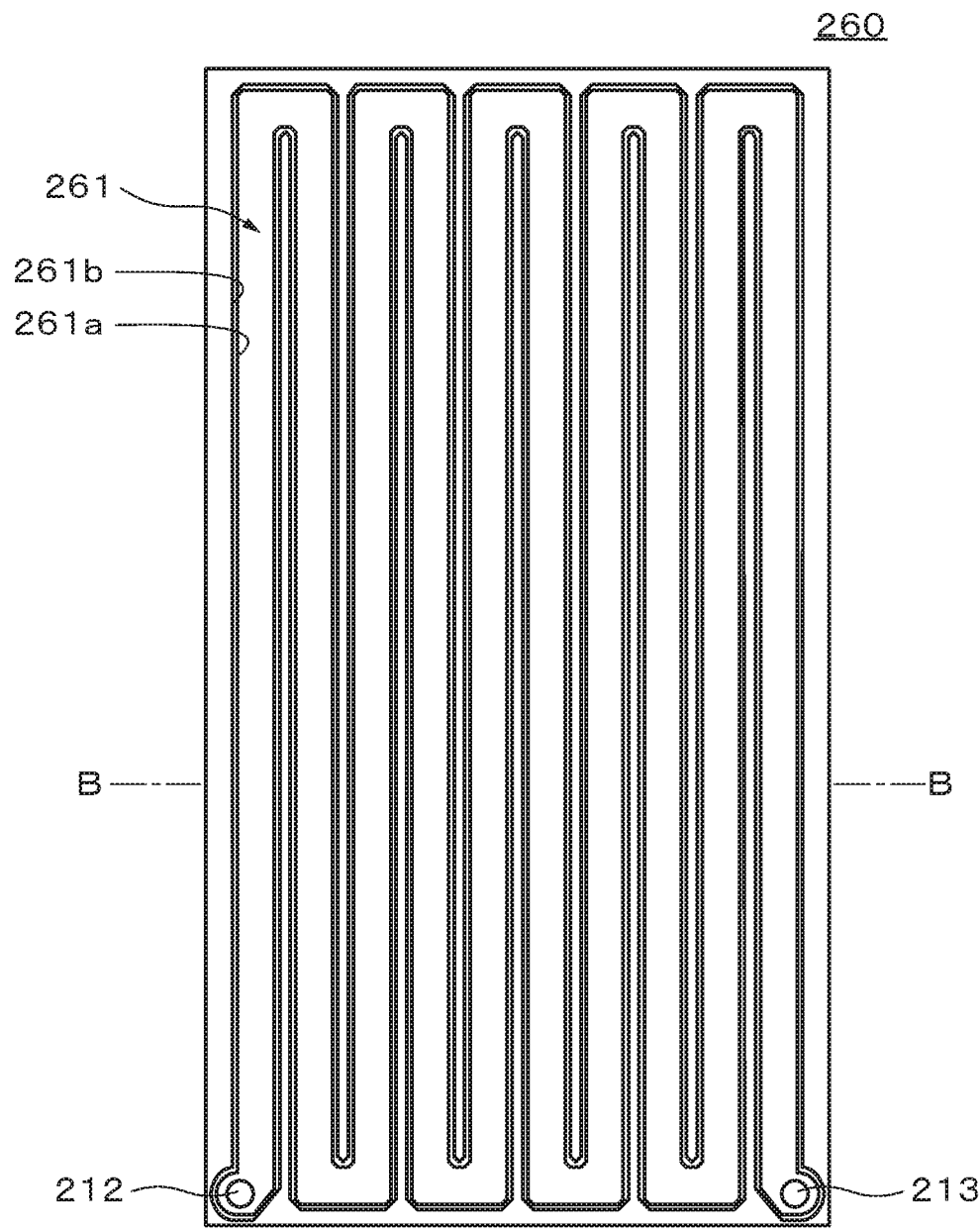
FIG. 19A A plan view for explaining a method for making the film formation roller used in the sputtering device according to the sixth embodiment of the invention.
Figure 19B:
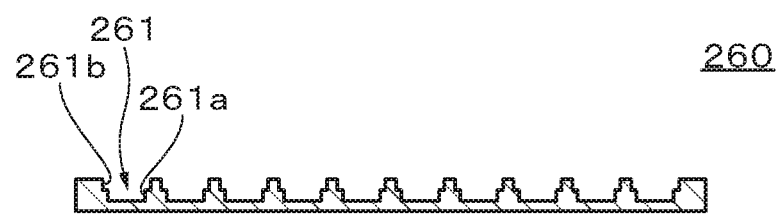
FIG. 19B A cross-sectional view along the B-B line of FIG. 19A.

As shown in FIG. 19A and FIG. 19B, prepared is a rectangular flat board 260 having the same planar shape as the one shown in the expansion plan of the cylindrical section 210 shown in FIG. 18A and FIG. 18B. Here, FIG. 19A is a plan view and FIG. 19B is a cross-sectional view along the B-B line in FIG. 19A. The thickness of the flat board 260 is the same as the thickness of the cylindrical section 210. A groove 26 having the cross-sectional shape with a step is formed on one major plane of the flat board 260. A lower groove 261a of the groove 261 has the same planar shape and depth as the flow passage 211 when the cylindrical section 210 is expanded in a plane. An upper groove 261b of the groove 261 has a planar shape which is similar to the lower groove 261 and a size larger. The flat board 260 has a hole 212 formed in the bottom of one end of the lower groove 261a of the groove 261 and a hole 213 formed in the bottom of the other end of the lower groove 261a of the groove 261.

Figure 20A:
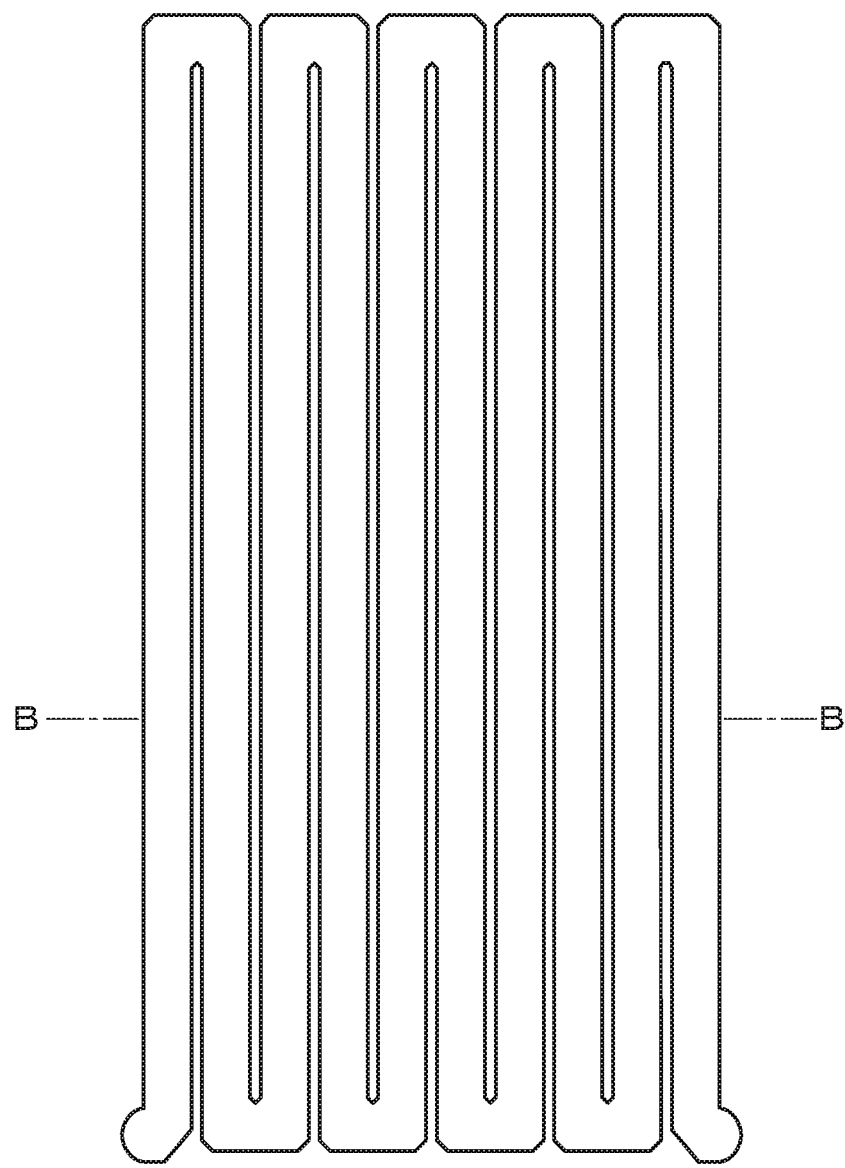
FIG. 20A A plan view for explaining the method for making the film formation roller used in the sputtering device according to the sixth embodiment of the invention.
Figure 20B:
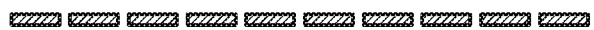
FIG. 20B A cross-sectional view along the B-B line of FIG. 20A.

Next, as shown in FIG. 20A and FIG. 20B, prepared is a flat board 270 having the same planar shape as the upper groove 261b of the groove 261 of the flat board 260 and the thickness as the same as the depth of the upper groove 261b. Here, FIG. 20A is a plan view and FIG. 20B is a cross-sectional view along the B-B line of FIG. 20A.

Figure 21A:
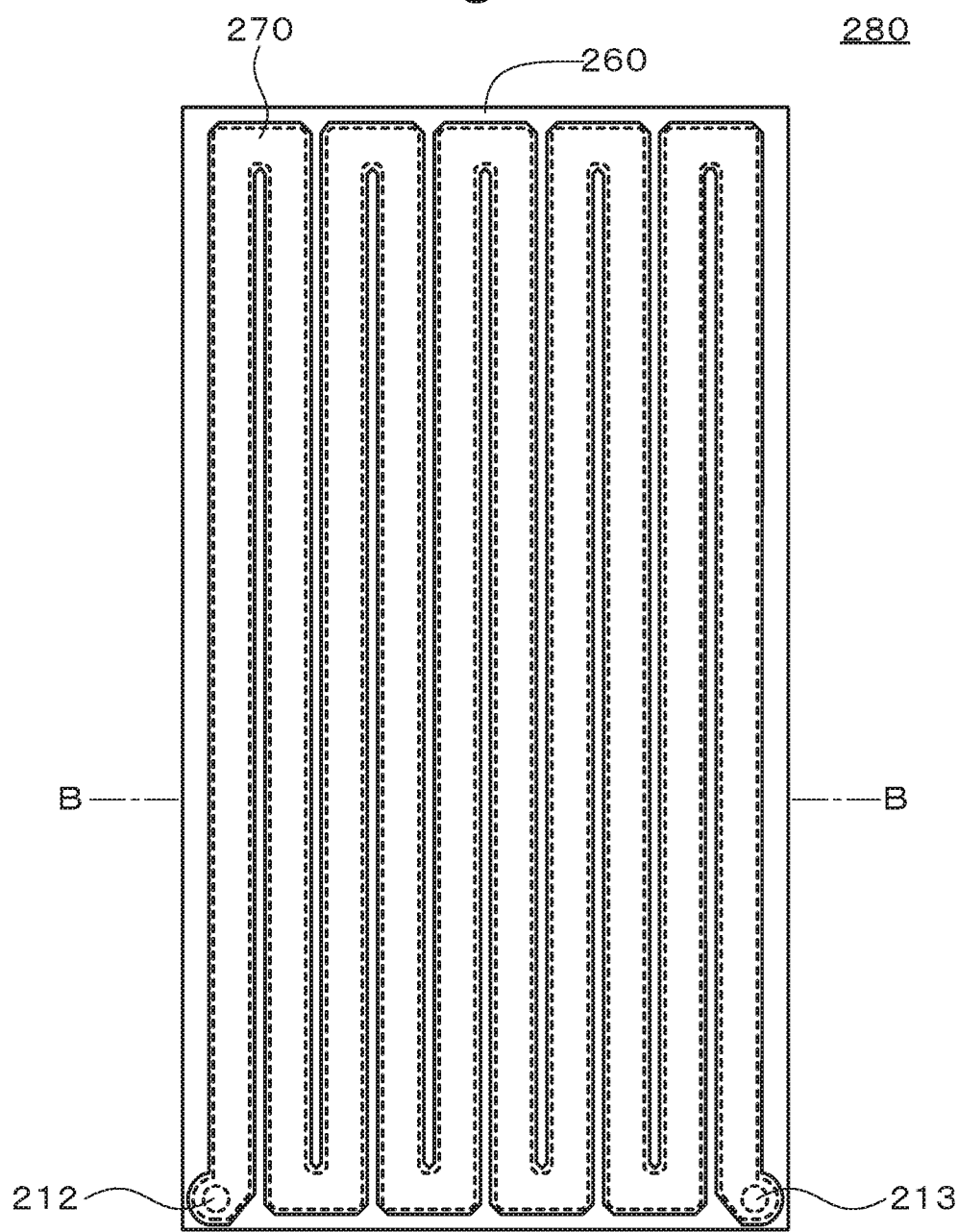
FIG. 21A A plan view for explaining the method for making the film formation roller used in the sputtering device according to the sixth embodiment of the invention.
Figure 21B:
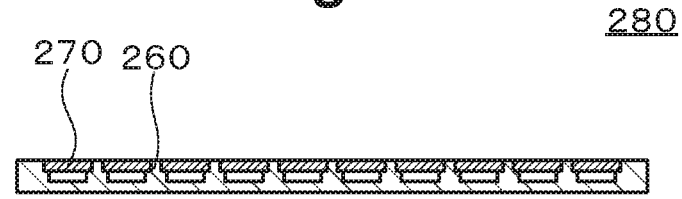
FIG. 21B A cross-sectional view along the B-B line of FIG. 21A.

Next, as shown in FIG. 21A and FIG. 21B, the flat board 270 is fitted to the upper groove 261b of the groove 261 of the flat board 260. Here, FIG. 21A is a plan view and FIG. 21B is a cross-sectional view along the B-B line of FIG. 21A.

Next, the boundary section (the linear section and the turn back section) between the flat board 260 and the flat board 270 shown in FIG. 21A and FIG. 21B is joined by friction stir welding. In this way, obtained is a rectangular flat board 280 in which the lower groove 261a of the groove 261 serving as the flow passage 211 is formed between the flat board 260 and the flat board 270.

Next, the flat board 280 is rounded in its longitudinal direction such that the surface of the flat board 280 on which friction stir welding was performed faces outward, one short side and the other short side of the board rounded like a cylinder are made contact with each other and jointed by friction stir welding. In this way, made is the cylindrical section 210 having the built-in flow passage 211 formed by the lower groove 261a of the groove 261 of the flat board 260.

Thereafter, the circular boards 220 and 230 and the shaft 240 are fixed to both ends of the cylindrical section 210.

As described above, the target film formation roller shown in FIG. 17A, FIG. 17B, FIG. 17C and FIG. 17D is made.

Figure 22:
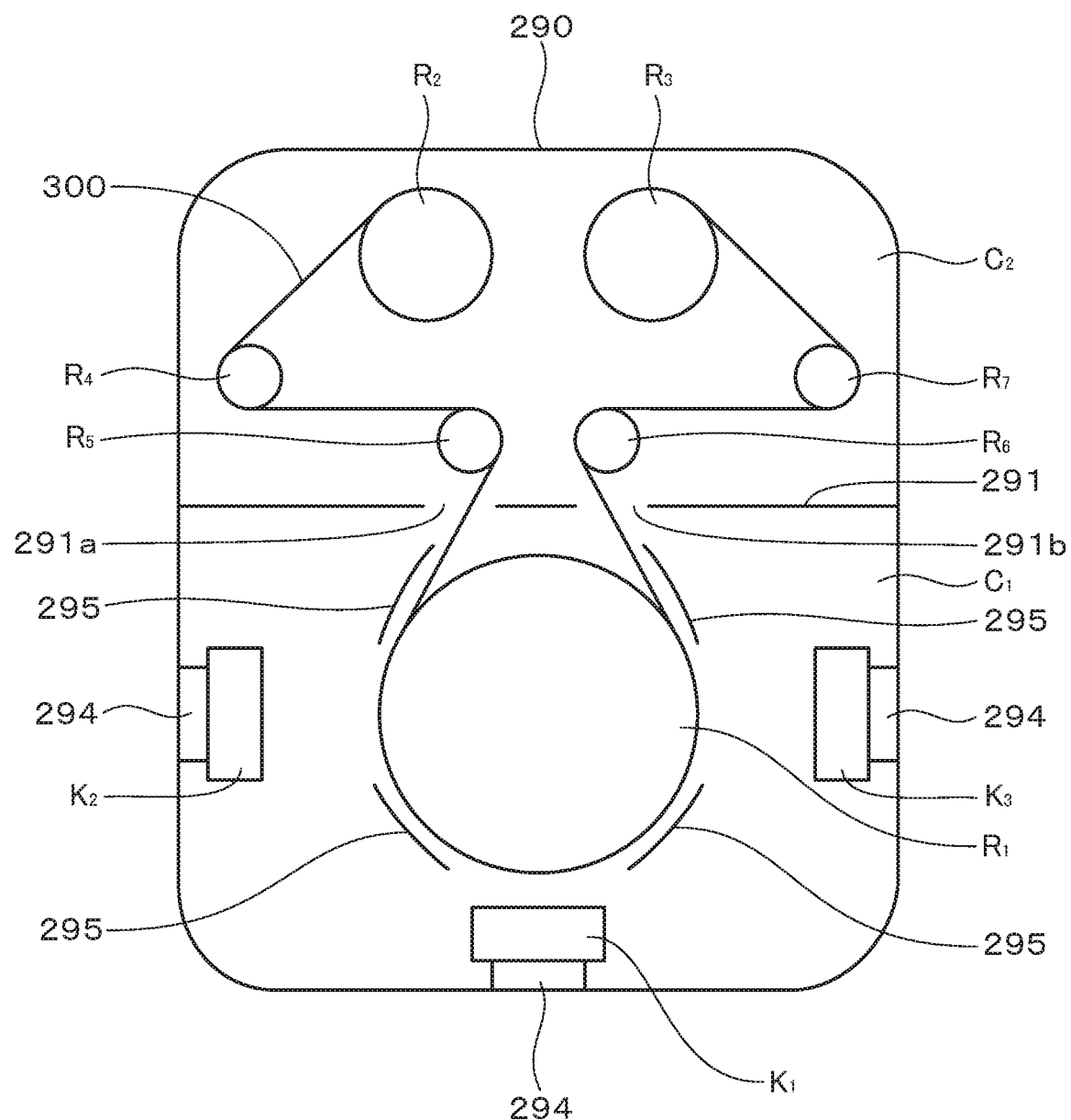
FIG. 22 A schematic view showing the sputtering device according to the sixth embodiment of the invention.

FIG. 22 and FIG. 23 show the sputtering device according to the sixth embodiment using the film formation roller shown in FIG. 17A, FIG. 17B, FIG. 17C and FIG. 17D. Here, FIG. 22 is a schematic view of the inside of the vacuum chamber of the sputtering device seen from a direction parallel to the film formation roller and FIG. 23 is a schematic view of the inside of the vacuum chamber of the sputtering device seen from a direction perpendicular to the film formation roller.

As shown in FIG. 22 and FIG. 23, in the sputtering device, the inside of the vacuum chamber 290 is vertically partioned into two sections by a partion board 291. A lower space below the partion board 291 of the inside of the vacuum chamber 290 is a film formation room $C_1$ and an upper space above the partion board 291 thereof is a film carrying room $C_2$. The film formation roller shown in FIG. 17A, FIG. 17B, FIG. 17C and FIG. 17D is disposed horizontally inside the film formation room $C_1$ as a film formation roller $R_1$. Both ends of the shaft 240 on both ends of the cylindrical section 210 of the film formation roller $R_1$ are inserted into a circular hole formed in support boards 292 and 293 fixed to both sidewalls of the film formation room $C_1$ and a circular hole formed in the both sidewalls of the film formation room $C_1$ and are rotatably supported by these holes. For example, three sputtering cathodes $K_1$, $K_2$ and $K_3$ are disposed on the inner wall of the film formation room $C_1$. Among them, the sputtering cathode $K_1$ is disposed on the bottom of the film formation room $C_1$ through an insulating member 294 and electrically isolated from the vacuum chamber 290. The sputtering cathodes $K_2$ and $K_3$ are disposed on sidewalls facing each other of the film formation room $C_1$ through the insulating member 294, respectively. The sputtering cathodes $K_1$, $K_2$ and $K_3$ may have the similar structure or different structures, but at least the sputtering cathode $K_1$ has the same structure as the first embodiment. A shield plate 295 is disposed around the cylindrical section 210 of the film formation roller $R_1$ to limit beams of sputtered particles generated from the sputtering cathodes $K_1$, $K_2$ and $K_3$ and irradiated a film when film formation is performed on a film. On the other hand, rollers $R_2$ and $R_3$ for unwinding/winding and carrying rollers (or guide rollers) $R_4$, $R_5$, $R_6$ and $R_7$ are disposed in the film carrying room $C_2$. Axes of the rollers $R_2$ and $R_3$ for unwinding/winding (only an axis $S_3$ of the roller $R_3$ is illustrated in FIG. 23) are inserted into a circular hole formed in the support boards 292 and 293 fixed to both sidewalls of the film formation room $C_1$ and a circular hole formed in the both sidewalls of the film formation room $C_1$ and are rotatably supported by these holes. Axes of the carrying rollers $R_4$, $R_5$, $R_6$ and $R_7$ (only axes $S_6$ and $S_7$ of the carrying rollers $R_6$ and $R_7$ are illustrated in FIG. 23) are rotatably supported by circular holes formed in the support boards 292 and 293. A film 300 is carried by the roller $R_2$ for unwinding/winding, the carrying rollers $R_4$ and $R_5$, the film formation roller $R_1$, the carrying rollers $R_6$ and $R_7$ and the roller $R_3$ for unwinding/winding. The film 300 can be carried by rotating the rollers $R_2$ and $R_3$ by a rotation mechanism not illustrated which is fixed to the shafts $S_2$ and $S_3$ of the rollers $R_2$ and $R_3$. In this case, by rotating the rollers $R_2$ and $R_3$ counterclockwise in FIG. 22, the film 300 can be unwinded from the roller $R_2$, carried through the carrying rollers $R_4$ and $R_5$, the film formation roller $R_1$ and the carrying rollers $R_6$ and $R_7$ and wound by the roller $R_3$. In contrast to this, by rotating the rollers $R_2$ and $R_3$ clockwise in FIG. 22, the film 300 can be unwound from the roller $R_3$, carried through the carrying rollers $R_7$ and $R_6$, the film formation roller $R_1$ and the carrying rollers $R_5$ and $R_4$ and wound by the roller $R_2$. That is, the film 300 can be carried in opposite directions. With this, for example, film formation is performed on the film formation roller $R_1$ while the film 300 is carried by rotating the rollers $R_2$ and $R_3$ counterclockwise in FIG. 22, and thereafter film formation is performed on the film formation roller $R_1$ while the film 300 is carried reversely by rotating the rollers $R_2$ and $R_3$ clockwise in FIG. 22. By repeating such film formation several times, a multi-layer thin film can be formed on the film 300. If necessary, at least one of the carrying rollers $R_4$ to $R_7$ may be constituted as the same as the film formation roller $R_1$ and used as a cooling roller. With this, the film 300 heated during film formation on the film formation roller $R_1$ can be cooled by the cooling roller while the film 300 is carried before the film 300 is wound by the roller $R_2$ or the roller $R_3$. Therefore, it is possible to prevent the problem of abrasion formed by mutual rubbing of the film 300 when the film 300 is cooled to shrink after the film 300 is wound by the roller $R_2$ or the roller $R_3$ at a high temperature. Slitlike holes 291$a$ and 291$b$ are formed in the partion board 291 to pass the film 300.

In the sputtering device, film formation is performed above the space surrounded by the sputtering target 10 while the film 300 wound around the cylindrical section 210 of the film formation roller $R_1$ is carried. In this case, the film 300 is carried for the sputtering target 10 in the direction traversing the long side sections of the sputtering target 10. The width of the film formation region of the film 300 in the direction parallel to the long side sections of the sputtering target 10 is selected to be less than b, and therefore the film 300 is held between the pair of short side sections facing each other of the sputtering target 10. The width of the film formation region is equal to the width of the film 300 when film formation is performed on the whole surface of the film 300.

[Method for Forming a Film by the Sputtering Device]

Although it is possible to perform film formation using two or more of the sputtering cathodes $K_1$, $K_2$ and $K_3$, described here is a case where film formation is performed by using only the sputtering cathode $K_1$.

Water is circulated through the flow passage 211 of the cylindrical section 210 of the film formation roller $R_1$ and temperature of the cylindrical section 210 is set to a temperature at which film formation is performed on the film 300. If necessary, an antifreeze solution such as ethylene glycol etc. is added to water circulated in the flow passage 211. An example of a control range of temperature of water circulated in the flow passage 211 is −10° C.~80° C.

The vacuum chamber 290 is evacuated to high vacuum by vacuum pumps, thereafter an Ar gas is introduced into the space surrounded by the sputtering target 10 as a sputtering gas and generally DC high voltage necessary to generate plasma is applied between the anode 40 and the sputtering cathode $K_1$ by a prescribed power source. Generally, the anode 40 is put to earth and negative high voltage (for example, −400V) is applied to the sputtering cathode $K_1$. With this, as shown in FIG. 3 and FIG. 4, the plasma 60 circulating along the inner surface of the sputtering target 10 is generated near the surface of the sputtering target 10.

The sputtering target 10 is sputtered by Ar ions in the plasma 60 circulating along the inner surface of the sputtering target 10. As a result, atoms constituting the sputtering target 10 are emitted upward from the space surrounded by the sputtering target 10. In this case, although atoms are emitted from everywhere near the plasma 60 of the erosion surface of the sputtering target 10, atoms emitted from the erosion surface of the short side sections of the sputtering target 10 are not basically used for film formation. To accomplish this, a horizontal shield plate may be disposed above the sputtering target 10 so as to shield both ends in the long side direction of the sputtering target 10, so that it is possible to prevent atoms emitted from the erosion surface of the short side sections of the sputtering target 10 from reaching the film 300 during film formation. Altenatively, the width b in the longitudinal direction of the sputtering target 10 may be set to be much larger than the width of the film 300, so that it is possible to prevent atoms emitted from the erosion surface of the short side sections of the sputtering target 10 from reaching the film 300 during film formation. A part of atoms emitted from the sputtering target 10 is stopped by the light stopping shield 50. As a result, the beams of sputtered particles 70 and 80 shown in FIG. 5 are obtained from the erosion surface of the long side sections of the sputtering target 10. The beams of sputtered particles 70 and 80 have almost uniform intensity distribution in the longituducal direction of the sputtering target 10.

When the stable beams of sputtered particles 70 and 80 are obtained, the rollers $R_2$ and $R_3$ for unwinding/winding the film 300 are rotated, for example, counterclockwise in FIG. 22, and film formation is performed on the film 300 wound around the film formation roller $R_1$ from below by the beams of sputtered particles 70 and 80 while the film 300 is carried at a constant speed through the carrying rollers $R_4$ and $R_5$, the film formation roller $R_1$ and the carrying rollers $R_6$ and $R_7$. In this case, tensional forces applied to the film 300 are controlled to be a constant value about 10~100 Newton (N), for example.

According to the sixth embodiment, since the cylindrical section 210 of the film formation roller $R_1$ is made of copper, copper alloy, aluminum or aluminum alloy having excellent termal conductivity, it is possible to cool or heat promptly and efficiently the cylindrical section 210 around which the film 300 to be film-formed is wound by pouring fluid such as cooling water or warm water into the flow passage 211 built in the cylindrical section 210, and furthermore it is possible to avoid the problem of the conventional film formation roller described above that it is deformed like a beer barrel in vacuum. Therefore, when film formation is performed on the film 300 by a roll-to-roll method in the sputtering device, it is possible to carry the film 300 smoothly, keeping the surface of the film 300 flat. In addition, since thermal response of the cylindrical section 210 made of copper, copper alloy, aluminum or aluminum alloy having excellent thermal conductivity is good, it is possible to control temperature of the cylindrical section 210 promptly and accurately by temperature or flow rate of the fluid such as cooling water or warm water poured into the flow passage 211, and therefore it is possible to control temperature of the film 300 wound around the cylindrical section 210 promptly and accurately, resulting good film formation on the film 300.

Heretofore, embodiments and examples of the present invention have been explained specifically. However, the present invention is not limited to these embodiments and examples, but contemplates various changes and modifications based on the technical idea of the present invention.

For example, numerical numbers, materials, structures, shapes, etc. presented in the aforementioned embodiments and examples are only examples, and the different numerical numbers, materials, structures, shapes, etc. may be used as necessary.

EXPLANATION OF REFERENCE NUMERALS 10, 10a, 10b, 10c, 10d Sputtering target
20, 20a, 20b, 20c, 20d Permanent magnet
30, 30a, 30b, 30c, 30d Yoke
40 Anode
50 Light stopping shield
60 Plasma
70, 70', 80, 80' Beam of sputtered particles
90 Horizontal shield plate
100 Vertical shield plate
S, S' Substrate
210 Cylindrical section
211 Flow passage
211a Linear section
211b Turn back section
220, 230 Circular board
240 Shaft
300 Film

We claim:

1. A sputtering device, comprising:
an anode; and
a sputtering cathode, comprising
a hollow sputtering target with a rectangular interior region and having a rectangular tubular configuration that extends in a lengthwise direction with a rectangular cross-section taken transverse to the lengthwise direction, the sputtering target having an open end at each end thereof and comprising a) a pair of major side walls that extend in the lengthwise direction of the sputtering target and that oppose each other across the rectangular interior region of the sputtering target, with opposing inner surfaces of the major side walls constituting sputtering erosion surfaces; and b) a pair of short side walls that extend in the lengthwise direction of the sputtering target and that oppose each other across the rectangular interior region of the sputtering target, the pair of short side walls connecting the pair of major side walls such that the rectangular interior region of the sputtering target is bounded by and delimited by the pair of major side walls along long sides thereof and by the pair of short side walls along short sides thereof,
each of the major side walls comprising a magnetic-field-generating assembly consisting of a pair of permanent-magnet units disposed near an outer surface of each major side wall of the sputtering target, wherein each magnetic-field-generating assembly comprises one permanent-magnet unit of the pair of permanent-magnet units disposed toward each open end of the sputtering target and with each of the permanent-magnet units having a north pole and a south pole, wherein 1) the north pole of a first permanent-magnet unit of the pair of permanent-magnet units faces toward the sputtering target and the south pole of said first permanent-magnet unit of the pair of permanent-magnet units faces away from the sputtering target and constitutes an away-facing pole of the first permanent-magnet unit; and 2) the south pole of a second permanent-magnet unit of the pair of permanent-magnet units faces toward the sputtering target and the north pole of said second permanent-magnet unit of the pair of permanent-magnet units faces away from the sputtering target and constitutes an away-facing pole of the second permanent-magnet unit; and
a magnetically conductive yoke extending between and magnetically connecting the away-facing poles of the first and second permanent-magnet units;
whereby a magnetic circuit is formed between each major side wall, the pair of permanent-magnet units, and the magnetically conductive yoke, the magnetic circuit extending from the north pole of said first permanent-magnet unit of the pair of permanent-magnet units; along longitudinally central portions of the major side wall to the south pole of said second permanent-magnet unit of the pair of permanent-magnet units; along said second permanent-magnet unit of the pair of permanent-magnet units to the north pole of said second permanent-magnet unit of the pair of permanent-magnet units; and along the magnetically conductive yoke back to the south pole of said first permanent-magnet unit of the pair of permanent-magnet units;
wherein each magnetic-field-generating assembly provides a magnetic field constituted by lines of magnetic force extending between the north pole of said first permanent-magnet unit and the south pole of said second permanent-magnet unit, such that the first and second permanent-magnet units are oriented with like polarities opposing each other across the rectangular interior region of the sputtering target such that plasma formed during operation of the sputtering device is essentially confined to regions within the rectangular interior region of the sputtering target that are adjacent to the sputtering erosion surfaces, the plasma generated being limited to a vicinity of inner surfaces of the sputtering target;
wherein the permanent-magnet units are positioned along a length of the sputtering target such that the lines of magnetic force generated by the magnetic circuit are restricted to the sputtering cathode; and
wherein the anode is disposed near one of the open ends of the sputtering target.

2. The sputtering device according to claim 1, wherein the pair of major side walls are made from different materials relative to each other to provide different species of sputtering atoms, the sputtering device further comprising a moveable shield that is positioned near one of the open ends of the sputtering target exterior to the sputtering target, the moveable shield being arranged to move transverse to the lengthwise direction of the sputtering target to selectively permit the different species of sputtering atoms to reach a to-be-coated substrate.

3. The sputtering device according to claim 1, further comprising a shield disposed near the end of the sputtering target that is opposite to the end near which the anode is located, the shield being configured and disposed to limit emission of plasma-caused radiation out of the sputtering target from the open end near which the shield is disposed.

4. The sputtering device according to claim 3, wherein the anode and the shield are electrically connected to each other to be held at the same electrical potential relative to the sputtering cathode.

5. The sputtering device according to claim 1, wherein the first and second permanent-magnet units each encircle the sputtering target.

6. The sputtering device according to claim 1, wherein the anode is spaced away from the sputtering target in the lengthwise direction thereof.

* * * * *